(12) United States Patent
Yamazaki et al.

(10) Patent No.: US 9,299,855 B2
(45) Date of Patent: Mar. 29, 2016

(54) SEMICONDUCTOR DEVICE HAVING DUAL GATE INSULATING LAYERS

(71) Applicant: Semiconductor Energy Laboratory Co., Ltd., Atsugi-shi, Kanagawa-ken (JP)

(72) Inventors: Shunpei Yamazaki, Setagaya (JP); Takuya Hirohashi, Atsugi (JP); Masahiro Takahashi, Atsugi (JP); Motoki Nakashima, Atsugi (JP); Ryosuke Watanabe, Yamato (JP); Masashi Tsubuku, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/447,875

(22) Filed: Jul. 31, 2014

(65) Prior Publication Data

US 2015/0041801 A1    Feb. 12, 2015

(30) Foreign Application Priority Data

Aug. 9, 2013    (JP) ................. 2013-165829

(51) Int. Cl.
*H01L 29/792*    (2006.01)
*H01L 29/24*    (2006.01)
*H01L 29/51*    (2006.01)
*H01L 29/49*    (2006.01)
*H01L 29/66*    (2006.01)
*H01L 29/786*    (2006.01)

(52) U.S. Cl.
CPC .......... *H01L 29/792* (2013.01); *H01L 29/4908* (2013.01); *H01L 29/513* (2013.01); *H01L 29/66969* (2013.01); *H01L 29/7869* (2013.01); *H01L 29/24* (2013.01)

(58) Field of Classification Search
CPC ............................. H01L 29/792; H01L 29/24
See application file for complete search history.

(56) References Cited

U.S. PATENT DOCUMENTS 5,528,032 A    6/1996  Uchiyama
5,731,856 A    3/1998  Kim et al.
(Continued)

FOREIGN PATENT DOCUMENTS

EP    1737044 A    12/2006
EP    2226847 A    9/2010
(Continued)

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.
(Continued)

*Primary Examiner* — Ida M Soward
(74) *Attorney, Agent, or Firm* — Eric J. Robinson; Robinson Intellectual Property Law Office, P.C.

(57) ABSTRACT

A semiconductor device includes a semiconductor layer, a gate electrode overlapping with the semiconductor layer, a first gate insulating layer between the semiconductor layer and the gate electrode, and a second gate insulating layer between the first gate insulating layer and the gate electrode. The first gate insulating layer includes an oxide in which the nitrogen content is lower than or equal to 5 at. %, and the second gate insulating layer includes charge trap states.

35 Claims, 27 Drawing Sheets

(56) References Cited

U.S. PATENT DOCUMENTS

| | | | |
|---|---|---|---|
| 5,744,864 A | 4/1998 | Cillessen et al. | |
| 5,834,827 A | 11/1998 | Miyasaka et al. | |
| 5,858,819 A | 1/1999 | Miyasaka | |
| 6,017,779 A | 1/2000 | Miyasaka | |
| 6,146,928 A | 11/2000 | Ishiguro et al. | |
| 6,294,274 B1 | 9/2001 | Kawazoe et al. | |
| 6,538,278 B1 * | 3/2003 | Chau ................ H01L 27/0922 257/324 | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,804,146 B2 * | 9/2010 | Ohkawa .......... H01L 21/823857 257/411 | |
| 7,910,490 B2 | 3/2011 | Akimoto et al. | |
| 7,932,521 B2 | 4/2011 | Akimoto et al. | |
| 7,940,085 B2 | 5/2011 | Kim et al. | |
| 8,217,680 B2 | 7/2012 | Kim et al. | |
| 8,274,077 B2 | 9/2012 | Akimoto et al. | |
| 8,385,105 B2 * | 2/2013 | Saito ............... 365/149 | |
| 8,466,463 B2 | 6/2013 | Akimoto et al. | |
| 8,653,514 B2 | 2/2014 | Yamazaki | |
| 8,841,675 B2 * | 9/2014 | Saito et al. ............... 257/67 | |
| 8,871,595 B2 * | 10/2014 | Ramkumar et al. ......... 438/287 | |
| 2001/0013607 A1 | 8/2001 | Miyasaka | |
| 2001/0032986 A1 | 10/2001 | Miyasaka | |
| 2001/0046027 A1 | 11/2001 | Tai et al. | |
| 2002/0028584 A1 | 3/2002 | Oku et al. | |
| 2002/0056838 A1 | 5/2002 | Ogawa | |
| 2002/0132454 A1 | 9/2002 | Ohtsu et al. | |
| 2003/0034518 A1 * | 2/2003 | Yoshikawa ................. 257/315 | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0082966 A1 * | 4/2005 | Yamazaki et al. ........... 313/498 | |
| 2005/0199959 A1 | 9/2005 | Chiang et al. | |
| 2005/0214996 A1 * | 9/2005 | Yoshino ................. 438/197 | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0211259 A1 * | 9/2006 | Maes et al. .................. 438/762 | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0051954 A1 | 3/2007 | Yan | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0215945 A1 | 9/2007 | Tokunaga et al. | |
| 2007/0252928 A1 | 11/2007 | Ito et al. | |
| 2007/0272922 A1 | 11/2007 | Kim et al. | |
| 2007/0287221 A1 | 12/2007 | Ong et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0067508 A1 | 3/2008 | Endo et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0142910 A1 | 6/2008 | Oh | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0079169 A1 | 4/2010 | Kim et al. | |
| 2010/0092820 A1 | 4/2010 | Itagaki et al. | |
| 2010/0109002 A1 | 5/2010 | Itagaki et al. | |
| 2010/0233848 A1 | 9/2010 | Ohara et al. | |
| 2011/0003429 A1 | 1/2011 | Oikawa et al. | |
| 2011/0114945 A1 | 5/2011 | Yamazaki et al. | |
| 2011/0127518 A1 | 6/2011 | Jung et al. | |
| 2011/0127523 A1 | 6/2011 | Yamazaki | |
| 2011/0133180 A1 | 6/2011 | Yamazaki | |
| 2011/0140205 A1 | 6/2011 | Sakata et al. | |
| 2011/0175647 A1 | 7/2011 | Kim et al. | |
| 2011/0216566 A1 | 9/2011 | Kamata | |
| 2012/0049288 A1 | 3/2012 | Maruyama et al. | |
| 2012/0138922 A1 | 6/2012 | Yamazaki et al. | |
| 2012/0241736 A1 | 9/2012 | Imoto et al. | |
| 2012/0241738 A1 | 9/2012 | Imoto et al. | |
| 2013/0153892 A1 | 6/2013 | Sasaki et al. | |
| 2013/0203214 A1 | 8/2013 | Isobe et al. | |
| 2013/0264563 A1 | 10/2013 | Okazaki et al. | |
| 2013/0270549 A1 * | 10/2013 | Okazaki ............ H01L 29/66969 257/43 | |
| 2013/0270550 A1 | 10/2013 | Okazaki et al. | |
| 2014/0030845 A1 | 1/2014 | Koezuka et al. | |
| 2014/0239379 A1 * | 8/2014 | Matsuo et al. ............... 257/324 | |
| 2015/0041802 A1 | 2/2015 | Yamazaki | |
| 2015/0053971 A1 | 2/2015 | Miyanaga et al. | |
| 2015/0155312 A1 * | 6/2015 | Yamazaki ................ 257/66 | |

(56) References Cited

U.S. PATENT DOCUMENTS

2015/0236168 A1* 8/2015 Miyamoto ........ H01L 29/78606
257/43

FOREIGN PATENT DOCUMENTS

| JP | 60-198861 | A | 10/1985 |
|---|---|---|---|
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| WO | WO-2004/114391 | | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Syposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Matter, (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 587-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in The In2O3 and Sc2O3-Bo Systems [A; Fe, Ga, Or Al; B: Mg, Mn, Fe, Ni, Cu, Or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Sigest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of The 6th Internatioanl Display Workshops, Dec. 3, 2008, pp. 581-584.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al.,."Improving The Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transpartent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW '09 : Proceedings of The 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of The 15th International Display Workshops, Dec. 3, 2008, pp. 1637-1640.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Yamazaki.S, "31a-F-3 A consideration of a cluster in an insulating film", Extended Abstracts of JSAP, The 18th spring meeting (1971), p. 124.

Sugimura.Y et al., "31a-F-2 Synthesis of Silicon Nitride Film using Catalyst", Extended Abstracts of JSAP, The 18th spring meeting (1971), p. 123.

* cited by examiner

FIG. 1A1
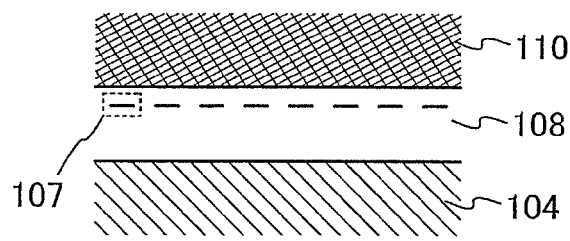
FIG. 1A2
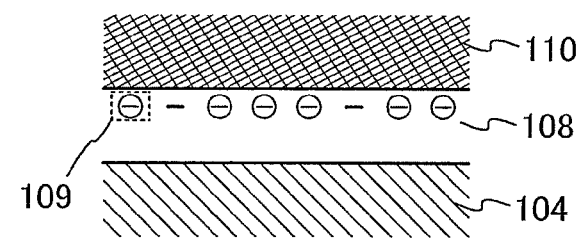
FIG. 1B
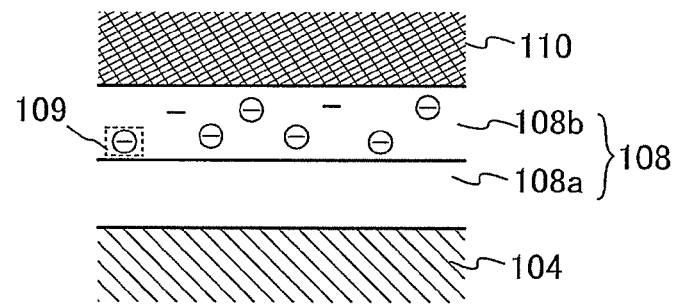

1301  1304  1303  1302  1306  1305  1307

|  | Charge : +1 | Charge:neutral | Charge : -1 |
|---|---|---|---|
| d(N-O) [Å] | 1.109(1.154) | 1.178(1.197) | 1.241(1.236) |
| ∠O-N-O [°] | 178.81(180) | 133.65(134) | 110.34(115) |

* a reference value of $NO_2$ molecule in a gas phase is shown in parentheses

|  | Charge: +1 | Charge : neutral | Charge: -1 |
|---|---|---|---|
| d(N-N)[Å] | 1.191 | 1.105(1.126) | 1.163 |
| d(N-O)[Å] | 1.154 | 1.175(1.186) | 1.310 |
| ∠N-N-O[°] | 174.52 | 172.81(180) | 130.71 |

* a reference value of $NO_2$ molecule in a gas phase is shown in parentheses

| | Charge : +1 | Charge : neutral | Charge : -1 |
|---|---|---|---|
| d(N-O) [Å] | 1.081 | 1.146 | 1.224 |

SEMICONDUCTOR DEVICE HAVING DUAL GATE INSULATING LAYERS

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a driving method thereof, or a manufacturing method thereof. In particular, one embodiment of the present invention relates to a semiconductor device, a display device, or a light-emitting device each including an oxide semiconductor.

In this specification and the like, a "semiconductor device" generally refers to a device which can function by utilizing semiconductor characteristics: an electro-optical device, a semiconductor circuit, and an electronic device are all included in the category of the semiconductor device.

2. Description of the Related Art

A technique in which a transistor is formed using a semiconductor layer has attracted attention. The transistor is used in a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, it is confirmed that an oxide semiconductor including an In—Ga—Zn oxide is applicable to a channel formation region of a thin film transistor (Non-Patent Document 1). Non-Patent Document 1 discloses a top-gate transistor including a hafnium oxide layer which is over and in contact with an oxide semiconductor layer including an In—Ga—Zn oxide and which is used as a gate insulating layer and an indium tin oxide layer which is over and in contact with the hafnium oxide layer and which is used as a gate electrode layer.

As a method for controlling the threshold voltage of a transistor using a silicon semiconductor, a method in which impurity elements imparting one conductivity are added to a region in which a channel is formed (channel doping) is known.

Meanwhile, it is known that in the case where oxygen vacancies exist in an oxide semiconductor of a transistor using an oxide semiconductor, part of the oxygen vacancies becomes donors and causes release of electrons serving as carriers. When the electrons serving as carriers are released, a channel is formed in the transistor without application of voltage to a gate, whereby the threshold voltage is shifted in the negative direction. Since it is difficult to completely eliminate oxygen vacancies included in the oxide semiconductor, the threshold voltage of the transistor using the oxide semiconductor is hardly controlled; thus, the transistor tends to be normally on.

A method for suppressing shift in threshold voltage of a transistor using an oxide semiconductor in negative direction has been studied; however, it is hard to say that a method for causing shift in the threshold voltage in the positive direction has been established.

It is known that in an MIS structure including a silicon semiconductor, negative charges are trapped in trap centers in an insulating layer formed over a semiconductor layer, and thus flat band voltage is shifted (changed) in the positive direction, and a cluster of metal is reported as a trap center (see Non-Patent Document 2).

REFERENCE

Non-Patent Document

[Non-Patent Document 1] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272

[Non-Patent Document 2] S. Yamazaki, "A consideration of a cluster in an insulating film", preliminary drafts for the $18^{th}$ spring meeting of the Japan Society of Applied Physics and Related Societies, 1971, Japan, Vol. 2, p. 124

SUMMARY OF THE INVENTION

In the case where an oxide semiconductor is used for a channel formation region in a transistor, when an insulating layer provided in contact with the oxide semiconductor includes a cluster of metal serving as a trap center, a charge is trapped in the trap center, and thus the threshold voltage can be shifted in the positive direction. However, since the charge trapped in the cluster of metal easily recombines, the electron cannot be a stable fixed charge.

In view of the above, an object of one embodiment of the present invention is to provide a transistor which has stable electrical characteristics. An object of one embodiment of the present invention is to provide a transistor in which a channel is formed in an oxide semiconductor and which has stable electrical characteristics. Another object of one embodiment of the present invention is to suppress shift in the threshold voltage of a transistor in which a channel is formed in an oxide semiconductor. Another object of one embodiment of the present invention is to provide a normally-off switching n-channel transistor which has a positive threshold voltage and in which a channel is formed in an oxide semiconductor.

Note that the description of these objects does not disturb the existence of other objects. One embodiment of the present invention does not necessarily achieve all the objects. Objects other than the above objects will be apparent from and can be derived from the description of the specification and the like.

One embodiment of the present invention is a semiconductor device including a semiconductor layer, a gate electrode overlapping with the semiconductor layer, a first gate insulating layer between the semiconductor layer and the gate electrode, and a second gate insulating layer between the first gate insulating layer and the gate electrode. The first gate insulating layer includes an oxide in which the nitrogen content is 5 at. % or lower, and the second gate insulating layer includes charge trap states.

It is preferable that in the second gate insulating layer, electrons be trapped in the charge trap states and thus the second gate insulating layer be negatively charged.

The second gate insulating layer preferably includes hafnium oxide.

The first gate insulating layer preferably includes silicon oxide.

Another embodiment of the present invention is a semiconductor device including a semiconductor layer, a gate electrode overlapping with the semiconductor layer, a first gate insulating layer between the semiconductor layer and the gate electrode, and a second gate insulating layer between the first gate insulating layer and the gate electrode. The first gate insulating layer includes silicon oxide in which the nitrogen content is 5 at. % or lower, and the second gate insulating layer includes hafnium oxide and is negatively charged.

Another embodiment of the present invention is a semiconductor device including a semiconductor layer, a gate electrode overlapping with the semiconductor layer, a first gate insulating layer between the semiconductor layer and the gate electrode, and a second gate insulating layer between the first gate insulating layer and the gate electrode. The first gate insulating layer includes silicon oxide in which the nitrogen content is 5 at. % or lower. The second gate insulating layer includes hafnium oxide. The threshold voltage is 0 V or higher.

In any of the above embodiments, the semiconductor layer is preferably including an oxide semiconductor. In that case, in particular, the semiconductor layer is preferably sandwiched between a first oxide layer and a second oxide layer between the semiconductor layer and the gate insulating layer. The first oxide layer and the second oxide layer each preferably include one or more metal elements included in the semiconductor layer.

One embodiment of the present invention can provide a transistor in which a channel is formed in an oxide semiconductor and which has stable electrical characteristics. Another embodiment of the present invention can suppress shift in the threshold voltage of a transistor in which a channel is formed in an oxide semiconductor. Another embodiment of the present invention can provide a normally-off switching n-channel transistor which has a positive threshold voltage in which a channel is formed in an oxide semiconductor.

BRIEF DESCRIPTION OF THE DRAWINGS

In the accompanying drawings:

FIGS. 1A1, 1A2, and 1B are each a conceptual diagram of a stacked-layer structure included in a semiconductor device of one embodiment;

DETAILED DESCRIPTION OF THE INVENTION

Figure 2A:
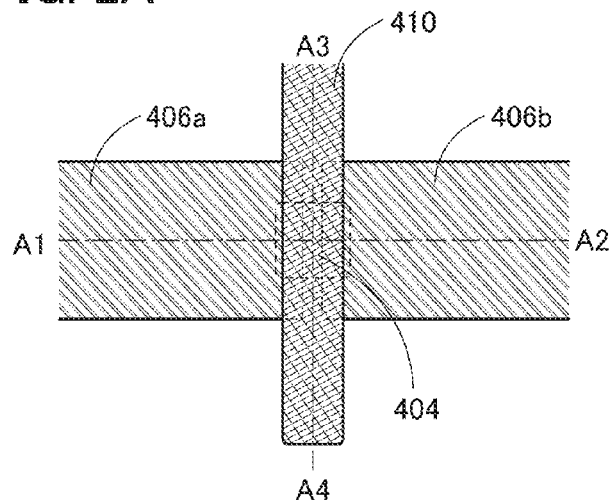
FIGS. 2A to 2C illustrate a structure example of a semiconductor device of one embodiment.

Embodiments of the present invention will be described in detail with reference to the accompanying drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component may be exaggerated for clarity. Therefore, embodiments of the present invention are not limited to such scales.

Note that in this specification and the like, ordinal numbers such as "first", "second", and the like are used in order to avoid confusion among components and do not limit the number.

Embodiment 1

In this embodiment, a stacked-layer structure included in a semiconductor device of one embodiment of the present invention will be described with reference to FIGS. 1A1, 1A2, and 1B.

A technical idea of one embodiment of the present invention is that in a transistor in which a channel is formed in an oxide semiconductor, a gate insulating layer overlapping with an oxide semiconductor layer includes a predetermined number of negative fixed charges and/or charge trap states (trap centers) trapping negative charges. As the gate insulating layer of the transistor, an insulating layer including a predetermined number of negative fixed charges is used; thus, even when voltage is not applied to a gate electrode layer, a negative electric field is always applied to a channel formation region. In other words, it is necessary that voltage applied to the gate electrode layer is increased to form the channel; accordingly, the threshold voltage of the transistor can be shifted (changed) in the positive direction. Furthermore, the transistor of one embodiment of the present invention has a structure in which the negative fixed charges and/or the charge trap states trapping the negative charges included in the gate insulating layer exist to be apart from the oxide semiconductor layer. Thus, the negative charges trapped in the charge trap states can be prevented from being released (injected) to the oxide semiconductor layer.

<Stacked-Layer Structure Included in Semiconductor Device>

FIGS. 1A1 and 1A2 are conceptual diagrams of the stacked-layer structure included in the semiconductor device of one embodiment of the present invention, FIG. 1A1 illustrates a stacked-layer structure including an oxide semiconductor layer 104, a gate insulating layer 108 provided over the oxide semiconductor layer 104 and including charge trap states 107, and a gate electrode layer 110 overlapping with the oxide semiconductor layer 104 with the gate insulating layer 108 provided therebetween. The charge trap states 107 included in the gate insulating layer 108 exist to be apart from the oxide semiconductor layer 104. After the stacked-layer structure illustrated in FIG. 1A1 is formed, the potential of the gate electrode layer 110 is kept higher than the potentials of a source and a drain (not illustrated) for one second or more, typically, one minute or more at a temperature higher than the operating temperature or the storage temperature of the semiconductor device, or higher than or equal to 125° C. and lower than or equal to 450° C., typically, higher than or equal to 150° C. and lower than or equal to 300° C.; thus, charges are trapped in the charge trap states 107 included in the gate insulating layer 108.

FIG. 1A2 is a conceptual diagram illustrating the structure of the stacked-layer structure included in the semiconductor device illustrated in FIG. 1A1 after treatment in which charges are trapped in the charge trap states 107 (hereinafter also referred to as charge trapping treatment) is performed on the semiconductor device. In FIG. 1A2, the stacked-layer structure includes negative charges 109 in which electrons are trapped in some or all of the charge trap states 107 included in the gate insulating layer 108. More specifically, the number of the negative charges 109 included in the gate insulating layer 108 can be controlled by the potential of the gate electrode layer 110 in the charge trapping treatment. The total number of electrons trapped in the charge trap states 107 (i.e., the total number of the negative charges 109 in FIG. 1A2) is increased linearly at the beginning of the charge trapping treatment, and the rate of increase gradually decreases and then converges on a certain value. The convergence value depends on the potential of the gate electrode layer 110. As the potential is higher, the number of trapped electrons is more likely to be large; however, it never exceeds the total number of the charge trap states 107.

When the gate insulating layer 108 includes negative charges, the threshold voltage of the semiconductor device is shifted in the positive direction. Furthermore, when the negative charges included in the gate insulating layer 108 are fixed charges, further shift of the threshold voltage is suppressed, and the semiconductor device can have stable electrical characteristics. For these reasons, in the semiconductor device having the stacked-layer structure illustrated in FIG. 1A2, the negative charges 109 trapped in the charge trap states are required to become stable negative fixed charges in the gate insulating layer 108 and not to be released from the gate insulating layer 108.

In the structure illustrated in FIG. 1A2, the negative charges 109 included in the gate insulating layer 108 exist to be apart from an interface of the oxide semiconductor layer 104; thus, release of the negative charges 109 to the oxide semiconductor layer 104 can be suppressed. Therefore, the gate insulating layer 108 which includes stable negative fixed charges and in which release of charges is suppressed can be formed. By providing such a gate insulating layer 108 including the stable negative charges 109, it is possible to provide a semiconductor device having stable electrical characteristics in which a shift of the threshold voltage after the charge trapping treatment, i.e., after a predetermined number of charges are held by the gate insulating layer 108, is suppressed.

In addition, the oxide semiconductor is effective for fixing negative charges stably because the effective mass of a hole is extremely large. That is, the injection of holes from the oxide semiconductor layer 104 to the gate insulating layer 108 does not occur and consequently a phenomenon in which the negative charges 109 combine with holes and disappear substantially cannot occur; thus, the negative charges 109 included in the gate insulating layer 108 can be stabilized.

Note that the amount of shift in the threshold voltage can be controlled by the total number of the negative charges 109 included in the gate insulating layer 108. It is preferable that in an n-channel transistor including the oxide semiconductor layer 104, the gate insulating layer 108 include the negative charges 109 to such a degree that it has positive threshold voltage and be controlled to be normally off.

<Structure Example of Gate Insulating Layer>

FIG. 1B illustrates a specific structure example of the stacked-layer structure having the structure illustrated in FIG. 1A2. The stacked-layer structure illustrated in FIG. 1B includes the gate insulating layer 108 including a gate insulating layer 108a and a gate insulating layer 108b over the oxide semiconductor layer 104 and the gate electrode layer 110 over the gate insulating layer 108. In the gate insulating layer 108, the gate insulating layer 108b is an insulating layer including the negative charges 109. In other words, the gate insulating layer 108b is a negatively charged insulating layer. The gate insulating layer 108a is an insulating layer between the oxide semiconductor layer 104 and the gate insulating layer 108b so that the oxide semiconductor layer 104 and the negative charges 109 included in the gate insulating layer 108b are apart from each other.

For the gate insulating layer 108b, a material and/or a formation method are/is selected so that the gate insulating layer 108b includes charge trap states. For example, as the gate insulating layer 108b, an insulating layer including an oxide (e.g., composite oxide) containing one or more elements selected from hafnium, aluminum, tantalum, and the like can be used. It is preferable to use an insulating layer including hafnium oxide, an insulating layer including aluminum oxide, an insulating layer including hafnium silicate, or an insulating layer including aluminum silicate. A high dielectric constant (high-k) material such as hafnium oxide is preferably used for a gate insulating layer because the thickness of the gate insulating layer can be increased to prevent gate leakage and at the same time electrical characteristics can be maintained. In this embodiment, an insulating layer including hafnium oxide is formed as the gate insulating layer 108b. It is possible to employ a sputtering method or an atomic layer deposition (ALD) method as a method for forming the gate insulating layer 108b.

In the gate insulating layer 108 having the stacked-layer structure, the gate insulating layer 108a in contact with the oxide semiconductor layer 104 preferably contains constituent elements different from those of the gate insulating layer 108b. For example, an insulating layer containing silicon oxide can be used as the gate insulating layer 108a. In an insulating layer containing silicon oxide, charge trap states are less likely to be formed than in the above insulating layer including an oxide (e.g., a composite oxide) containing one or more elements selected from hafnium, aluminum, tantalum, and the like. Thus, by providing the gate insulating layer 108a between the oxide semiconductor layer 104 and the gate insulating layer 108b, the negative charges 109 included in the gate insulating layer 108 can be more surely apart from the oxide semiconductor layer 104. In other words, the negative charges 109 included in the gate insulating layer 108 can be stable negative fixed charges.

The gate insulating layer 108b in contact with the oxide semiconductor layer 104 preferably includes an oxide with extremely low nitrogen content. In particular, the oxide with extremely low nitrogen content is preferably included in a region in contact with the oxide semiconductor layer 104. The nitrogen content in the oxide is preferably as low as possible; for example, the nitrogen content is 5 at. % or lower, preferably 1 at. % or lower, more preferably 0.5 at. % or lower, further more preferably 0.1 at. % or lower.

In an oxide with extremely low nitrogen content, charge trap states are hardly formed. Therefore, the following can be suppressed: unintended charges are trapped in charge trap states in an oxide film and thus the gate insulating layer 108 is charged, so that the threshold voltage of a semiconductor device is shifted. By providing the gate insulating layer 108a including an oxide that hardly causes charge trap states, between the gate insulating layer 108b including charge trap states and the oxide semiconductor layer 104 as described above, release (injection) of the negative charges 109 in the gate insulating layer 108b to the oxide semiconductor layer 104 through the gate insulating layer 108a can be suppressed.

In addition, by providing such an oxide film to be in contact with the oxide semiconductor layer 104, generation of interface states at an interface between the oxide semiconductor layer 104 and the gate insulating layer 108a is suppressed. Thus, generation of decrease in the electric field mobility of the semiconductor device, shift in the threshold voltage, and the like owing to the interface states can be suppressed.

Note that the gate insulating layer 108a is preferably formed by a chemical vapor deposition (CVD) method. A CVD method includes a PECVD method, a thermal CVD method, and the like. A film with a preferable film quality can be easily formed by a CVD method as compared with a sputtering method, and charge trap states are less likely to be formed in an insulating layer formed by a CVD method. Accordingly, by forming the gate insulating layer 108a by a CVD method, the amount of leakage current between a gate and a drain or between a gate and a source can be reduced in the transistor.

The semiconductor device in this embodiment includes a predetermined number of negative fixed charges in the gate insulating layer 108, and the negative fixed charges are apart from the oxide semiconductor layer 104; thus, the threshold voltage can be shifted in the positive direction and the shift after that can be suppressed. In other words, the structure described in this embodiment enables formation of a semiconductor device having a threshold voltage which is fixed to a positive value.

Note that charge trapping treatment may be performed during a process of manufacturing the semiconductor device, or in a period after manufacture of the semiconductor device and before shipment. For example, the treatment may be performed at any step before factory shipment, such as after formation of a wire metal connected to the source electrode or the drain electrode of the semiconductor device, after pretreatment (wafer processing), after a wafer-dicing step, or after packaging. In any case, it is preferable that the semiconductor device be not exposed to environment at temperatures higher than or equal to 125° C. for one hour or more after the step.

Instead of the oxide semiconductor layer 104, a semiconductor layer including a semiconductor other than an oxide semiconductor, e.g., a compound semiconductor such as silicon germanium, silicon carbide, or gallium nitride, or an organic semiconductor, in addition to a semiconductor such as silicon or germanium, in a channel formation region may be used. Even in the case where an oxide semiconductor is not used, the above semiconductor device including the gate insulating layer 108a and the gate insulating layer 108b can shift the threshold voltage in the positive direction and suppress the shift after that.

At least part of this embodiment can be implemented in combination with any of the other embodiments described in this specification as appropriate.

Embodiment 2

In this embodiment, a semiconductor device of one embodiment of the present invention is described. A transistor is described below as an example of the semiconductor device.

<Transistor Structure 1>

Figure 2B:
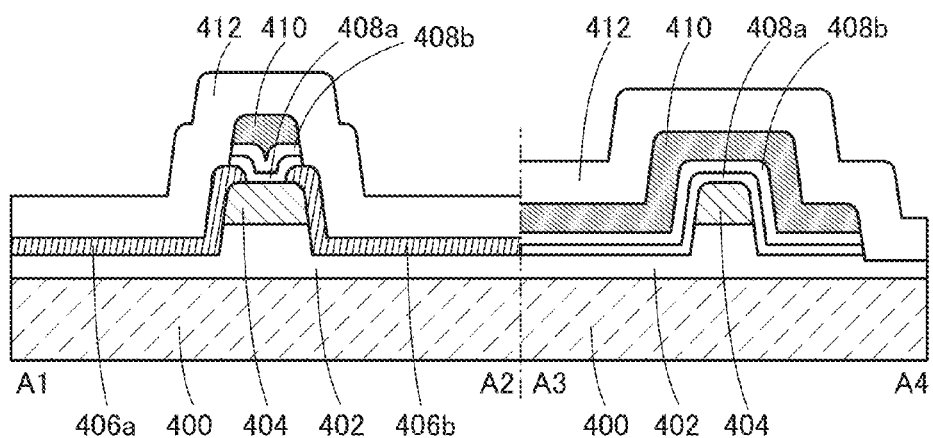

FIGS. 2A and 2B are a top view and a cross-sectional view of a transistor of one embodiment of the present invention. FIG. 2A is a top view and FIG. 2B is a cross-sectional view taken along dashed-dotted line A1-A2 and dashed-dotted line A3-A4 in FIG. 2A. Note that for simplification of the drawing, some components in the top view in FIG. 2A are not illustrated.

The transistor illustrated in FIGS. 2A and 2B includes a base insulating layer 402 having a projecting portion over a substrate 400, an oxide semiconductor layer 404 over the projecting portion of the base insulating layer 402, a source electrode layer 406a and a drain electrode layer 406b in contact with a top surface and side surfaces of the oxide semiconductor layer 404, a gate insulating layer 408a over the oxide semiconductor layer 404, the source electrode layer 406a, and the drain electrode layer 406b, a gate insulating layer 408b over the gate insulating layer 408a, a gate electrode layer 410 which is in contact with a top surface of the gate insulating layer 408b and faces the top surface and side surfaces of the oxide semiconductor layer 404, and an insulating layer 412 over the source electrode layer 406a, the drain electrode layer 406b, and the gate electrode layer 410. Note that the base insulating layer 402 does not necessarily include a projecting portion.

As illustrated in FIG. 2B, side surfaces of the source electrode layer 406a and the drain electrode layer 406b are in contact with the side surfaces of the oxide semiconductor layer 404. The oxide semiconductor layer 404 can be electrically surrounded by an electric field of the gate electrode layer 410 (a structure in which an oxide semiconductor layer is electrically surrounded by an electric field of a gate electrode layer is referred to as a surrounded channel (s-channel) structure). Therefore, a channel is formed in the entire oxide semiconductor layer 404 (bulk). In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor can be preferably less than or equal to 40 nm, more preferably less than or equal to 30 nm, still more preferably less than or equal to 20 nm and the channel width of the transistor can be preferably less than or equal to 40 nm, more preferably less than or equal to 30 nm, still more preferably less than or equal to 20 nm.

Note that a channel length refers to a distance between a source (a source region or a source electrode layer) and a drain (a drain region or a drain electrode layer) in a region where a semiconductor layer and a gate electrode layer overlap with each other in a top view. Accordingly, in FIG. 2A, a channel length is a distance between the source electrode layer 406a and the drain electrode layer 406b in a region where the oxide semiconductor layer 404 and the gate electrode layer 410 overlap with each other. A channel width refers to the width of a source or a drain in a region where a semiconductor layer overlaps with a gate electrode layer. Accordingly, in FIG. 2A, a channel width (W) is the width of the source electrode layer 406a or the drain electrode layer 406b in a region where the oxide semiconductor layer 404 overlaps with the gate electrode layer 410.

The gate insulating layer 408a corresponds to the gate insulating layer 108a in the above embodiment, and the description of the gate insulating layer 108a can be referred to for the detailed description. Note that the gate insulating layer 408a may have either a single-layer structure or a stacked-layer structure.

The gate insulating layer 408b corresponds to the gate insulating layer 108b in the above embodiment, and the description of the gate insulating layer 108b can be referred to for the detailed description. Note that the gate insulating layer 408b may have either a single-layer structure or a stacked-layer structure.

The substrate 400 is not limited to a simple support, and may be a substrate where an element such as a transistor or a capacitor is formed. In that case, at least one of the gate electrode layer 410, the source electrode layer 406a, and the drain electrode layer 406b of the transistor may be electrically connected to the above element.

The base insulating layer 402 can have a function of supplying oxygen to the oxide semiconductor layer 404 as well as a function of preventing diffusion of impurities from the substrate 400. Thus, the base insulating layer 402 is preferably an insulating layer containing oxygen. For example, an insulating layer containing oxygen more than that in the stoichiometric composition is more preferable. Note that in the case where the substrate 400 is a substrate where an element is formed as described above, the base insulating layer 402 has also a function as an interlayer insulating layer. In that case, a surface of the base insulating layer 402 may be planarized. For example, the base insulating layer 402 may be subjected to planarization treatment such as chemical mechanical polishing (CMP) treatment.

The oxide semiconductor layer 404 is described in detail below.

The oxide semiconductor layer 404 is an oxide containing indium. An oxide can have high carrier mobility (electron mobility) by containing indium, for example. In addition, the oxide semiconductor layer 404 preferably includes an element M. The element M is aluminum, gallium, yttrium, or tin, for example. The element M is an element having high bonding energy with oxygen, for example. The element M is an element that can increase the energy gap of the oxide, for example. In addition, the oxide semiconductor layer 404 preferably contains zinc. When the oxide contains zinc, the oxide is easily crystallized, for example. The energy at the top of the valence band of the oxide can be controlled with the atomic ratio of zinc, for example.

Note that the oxide semiconductor layer 404 is not limited to the oxide containing indium. The oxide semiconductor layer 404 may be a Zn—Sn oxide or a Ga—Sn oxide, for example.

As the oxide semiconductor layer 404, an oxide with a wide energy gap is used. For example, the energy gap of the oxide semiconductor layer 404 is set to be greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

In the case where the oxide semiconductor layer 404 is formed by a sputtering method, a target containing indium is preferably used in order to reduce the number of particles. In addition, if an oxide target having a high atomic ratio of the element M is used, the conductivity of the target may be decreased. In the case where a target containing indium is used, the conductivity of the target can be increased and DC discharge and AC discharge are facilitated; therefore, film formation over a large-sized substrate can be easily performed. Thus, semiconductor devices can be manufactured with high productivity.

In the case where the oxide semiconductor layer 404 is formed by a sputtering method, the atomic ratio of In to M and Zn contained in the target may be 3:1:1, 3:1:2, 3:1:4, 1:1:0.5, 1:1:1, 1:1:2, or the like.

In the case where the oxide semiconductor layer 404 is formed by a sputtering method, a film having an atomic ratio different from the atomic ratio of the target used may be formed. Especially for zinc, the proportion of zinc in a deposited film is smaller than the proportion of the target in some cases. Specifically, the proportion of zinc in the film is 40 atomic % to 90 atomic % of that of zinc in the target in some cases.

An influence of impurities in the oxide semiconductor layer 404 is described below. In order to obtain stable electrical characteristics of a transistor, it is effective to reduce the concentration of impurities in the oxide semiconductor layer 404 to have lower carrier density so that the oxide semiconductor layer 404 is highly purified. The carrier density of the oxide semiconductor layer 404 is set to be lower than $1\times10^{17}/cm^3$, lower than $1\times10^{15}/cm^3$, or lower than $1\times10^{13}/cm^3$. In order to reduce the concentration of impurities in the oxide semiconductor layer 404, the concentration of impurities in a film which is adjacent to the oxide semiconductor layer 404 are preferably reduced.

For example, silicon in the oxide semiconductor layer 404 might serve as a carrier trap or a carrier generation source. Therefore, the concentration of silicon in a region between the oxide semiconductor layer 404 and the base insulating layer 402 measured by secondary ion mass spectrometry (SIMS) is set to be lower than $1\times10^{19}$ atoms/$cm^3$, preferably lower than $5\times10^{18}$ atoms/$cm^3$, further preferably lower than $2\times10^{18}$ atoms/$cm^3$. The concentration of silicon in a region between the oxide semiconductor layer 404 and the gate insulating layer 408a measured by SIMS is set to be lower than $1\times10^{19}$ atoms/$cm^3$, preferably lower than $5\times10^{18}$ atoms/$cm^3$, further preferably lower than $2\times10^{18}$ atoms/$cm^3$.

Furthermore, when hydrogen is contained in the oxide semiconductor layer 404, the carrier density is increased in some cases. The concentration of hydrogen in the oxide semiconductor layer 404 measured by SIMS is set to be lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. When nitrogen is contained in the oxide semiconductor layer 404, the carrier density is increased in some cases. The concentration of nitrogen in the oxide semiconductor layer 404 measured by SIMS is set to be lower than $5 \times 10^{19}$ atoms/cm$^{-3}$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

It is preferable to reduce the concentration of hydrogen in the base insulating layer 402 in order to reduce the concentration of hydrogen in the oxide semiconductor layer 404. The concentration of hydrogen in the base insulating layer 402 measured by SIMS is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the base insulating layer 402 in order to reduce the concentration of nitrogen in the oxide semiconductor layer 404. The concentration of nitrogen in the base insulating layer 402 measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

It is preferable to reduce the concentration of hydrogen in the gate insulating layer 408a in order to reduce the concentration of hydrogen in the oxide semiconductor layer 404. The concentration of hydrogen in the gate insulating layer 408a measured by SIMS is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. It is preferable to reduce the concentration of nitrogen in the gate insulating layer 408a in order to reduce the concentration of nitrogen in the oxide semiconductor layer 404. The concentration of nitrogen in the gate insulating layer 408a measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

A structure of an oxide semiconductor layer which can be used as the oxide semiconductor layer 404 is described below.

An oxide semiconductor layer is classified roughly into a single-crystal oxide semiconductor layer and a non-single-crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of c-axis aligned crystal parts.

When a combined analysis image (also referred to as a high-resolution TEM image) of a bright-field image and a diffraction pattern of the CAAC-OS layer is observed by a transmission electron microscope (TEM), a plurality of crystal parts are seen. However, in the high-resolution TEM image, a boundary between crystal parts, that is, a grain boundary is not clearly observed. Thus, in the CAAC-OS layer, a reduction in electron mobility due to the grain boundary is less likely to occur.

In the high-resolution cross-sectional TEM image of the CAAC-OS layer observed in a direction substantially parallel to the sample surface, metal atoms are arranged in a layered manner in the crystal parts. Each metal atom layer has a morphology reflecting unevenness of a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the high-resolution planar TEM image of the CAAC-OS layer observed in a direction substantially perpendicular to the sample surface, metal atoms are arranged in a triangular or hexagonal configuration in the crystal parts. However, there is no regularity of arrangement of metal atoms between different crystal parts.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. A term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

In this specification, the trigonal and rhombohedral crystal systems are included in the hexagonal crystal system.

Note that when the CAAC-OS layer with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appear at around 31° and a peak of 2θ not appear at around 36°.

The CAAC-OS layer is an oxide semiconductor layer with low impurity concentration. The impurity means an element other than the main components of the oxide semiconductor layer, such as hydrogen, carbon, silicon, or a transition metal element, in particular, an element (e.g., silicon) which has higher bonding strength with oxygen than a metal element included in the oxide semiconductor layer causes disorder of atomic arrangement in the oxide semiconductor layer because the element deprives the oxide semiconductor layer of oxygen, thereby reducing crystallinity. Furthermore, a heavy metal such as iron or nickel, argon, carbon dioxide, and the like have a large atomic radius (or molecular radius); therefore, when any of such elements is contained in the oxide semiconductor layer, the element causes disorder of the atomic arrangement of the oxide semiconductor layer, thereby reducing crystallinity. Note that the impurity contained in the oxide semiconductor layer might become a carrier trap or a carrier generation source.

The CAAC-OS layer is an oxide semiconductor layer with a low density of defect states. For example, oxygen vacancies in the oxide semiconductor layer serve as carrier traps or serve as carrier generation sources when hydrogen is trapped therein.

The state in which impurity concentration is low and density of defect states is low (the number of oxygen vacancies is small) is referred to as a "highly purified intrinsic" or "substantially highly purified intrinsic" state. A highly-purified intrinsic or substantially highly-purified intrinsic oxide semiconductor layer has few carrier generation sources, and thus can have a low carrier density. Thus, a transistor using the oxide semiconductor layer rarely has a negative threshold voltage (rarely has normally-on characteristics). A highly-purified intrinsic or substantially highly-purified intrinsic oxide semiconductor layer has few carrier traps. Accordingly, the transistor using the oxide semiconductor layer has a small change in electrical characteristics and high reliability. Note that charges trapped in the carrier traps in the oxide semiconductor layer take a long time to be released and may behave like fixed charges. Thus, the transistor using the oxide semiconductor layer with a high impurity concentration and a high density of defect states has unstable electrical characteristics in some cases.

In a transistor using the CAAC-OS layer, change in electrical characteristics due to irradiation with visible light or ultraviolet light is small.

Next, a microcrystalline oxide semiconductor layer is described.

In the high-resolution TEM image of the microcrystalline oxide semiconductor layer, there are a region where a crystal part is clearly observed and a region where a crystal part is not observed. In most cases, the size of a crystal part included in the microcrystalline oxide semiconductor layer is greater than or equal to 1 nm and less than or equal to 100 nm, or greater than or equal to 1 nm and less than or equal to 10 nm, for example. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) film. In a high-resolution TEM image of the nc-OS film, a grain boundary cannot be found clearly in the nc-OS film in some cases.

In the nc-OS layer, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS layer does not have regularity of crystal orientation between different crystal parts. Thus, the orientation of the whole film is not observed. Accordingly, in some cases, the nc-OS layer cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., larger than or equal to 50 nm) larger than the diameter of a crystal part. Meanwhile, spots are shown in a nanobeam electron diffraction pattern of the nc-OS layer obtained by using an electron beam having a probe diameter close to or smaller than the diameter of a crystal part. Furthermore, in a nanobeam electron diffraction pattern of the nc-OS layer, regions with high luminance in a circular (ring) pattern are shown in some cases. Also in a nanobeam electron diffraction pattern of the nc-OS layer, a plurality of spots are shown in a ring-like region in some cases.

Since the nc-OS layer is an oxide semiconductor layer having higher regularity than the amorphous oxide semiconductor layer, the nc-OS layer has a lower density of defect states than the amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may include two or more layers of an amorphous oxide semiconductor layer, a microcrystalline oxide semiconductor layer, and a CAAC-OS layer, for example.

The oxide semiconductor layer 404 may be a stack of oxide semiconductor layers. For example, the oxide semiconductor layer 404 may have a two-layer structure or a three-layer structure.

Figure 2C:
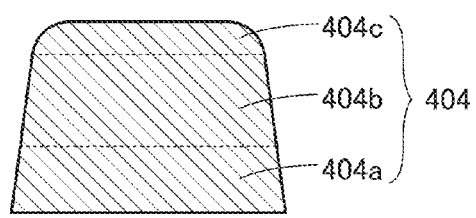

For example, the case where the oxide semiconductor layer 404 has a three-layer structure is described. In FIG. 2C, the oxide semiconductor layer 404 is a film in which an oxide semiconductor layer 404a, an oxide semiconductor layer 404b, and an oxide semiconductor layer 404c are stacked in this order.

For the oxide semiconductor layer 404b (middle layer), the above description of the oxide semiconductor layer 404 can be referred to. The oxide semiconductor layer 404a (bottom layer) and the oxide semiconductor layer 404c (top layer) include one or more elements (other than oxygen) included in the oxide semiconductor layer 404b. Since the oxide semiconductor layer 404a and the oxide semiconductor layer 404c each include one or more elements (other than oxygen) included in the oxide semiconductor layer 404b, an interface state is less likely to be formed at the interface between the oxide semiconductor layer 404a and the oxide semiconductor layer 404b and the interface between the oxide semiconductor layer 404b and the oxide semiconductor layer 404c.

In the case of using an In-M-Zn oxide as the oxide semiconductor layer 404a, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively, In the case of using an In-M-Zn oxide as the oxide semiconductor layer 404b, when summation of In and M is assumed to be 100 atomic %, the proportions of In and M are preferably set to be greater than or equal to 25 atomic % and less than 75 atomic %, respectively, further preferably greater than or equal to 34 atomic % and less than 66 atomic %, respectively. In the case of using an In-M-Zn oxide as the oxide semiconductor layer 404c, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. Note that the oxide semiconductor layer 404c may be an oxide that is a type the same as that of the oxide semiconductor layer 404a.

Here, in some cases, there is a mixed region of the oxide semiconductor layer 404a and the oxide semiconductor layer 404b between the oxide semiconductor layer 404a and the oxide semiconductor layer 404b. Further, in some cases, there is a mixed region of the oxide semiconductor layer 404b and the oxide semiconductor layer 404c between the oxide semiconductor layer 404b and the oxide semiconductor layer 404c. The mixed region has a low interface state density. For that reason, the stack of the oxide semiconductor layer 404a, the oxide semiconductor layer 404b, and the oxide semiconductor layer 404c has a band structure where energy at each interface and in the vicinity of the interface is changed continuously (continuous junction).

As the oxide semiconductor layer 404b, an oxide having an electron affinity higher than those of the oxide semiconductor layers 404a and 404c is used. For example, as the oxide semiconductor layer 404b, an oxide having an electron affinity higher than those of the oxide semiconductor layers 404a and 404c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

At this time, when an electric field is applied to the gate electrode layer 410, a channel is formed in the oxide semiconductor layer 404b having the highest electron affinity in the oxide semiconductor layer 404a, the oxide semiconductor layer 404b, and the oxide semiconductor layer 404c.

Moreover, the thickness of the oxide semiconductor layer 404c is preferably as small as possible to increase the on-state current of the transistor. The thickness of the oxide semiconductor layer 404c is set to be less than 10 nm, preferably less than or equal to 5 nm, further preferably less than or equal to 3 nm, for example. Meanwhile, the oxide semiconductor layer 404c has a function of blocking elements other than oxygen (such as silicon) included in the gate insulating layer 408a from entering the oxide semiconductor layer 404b where a channel is formed. For this reason, it is preferable that the oxide semiconductor layer 404c have a certain thickness. The thickness of the oxide semiconductor layer 404c is set to be greater than or equal to 0.3 nm, preferably greater than or equal to 1 nm, further preferably greater than or equal to 2 nm, for example.

To improve reliability, preferably, the thickness of the oxide semiconductor layer 404a is large and the thickness of the oxide semiconductor layer 404c is small. Specifically, the thickness of the oxide semiconductor layer 404a is set to be greater than or equal to 20 nm, preferably greater than or equal to 30 nm, further preferably greater than or equal to 40 nm, still further preferably greater than or equal to 60 nm. With the oxide semiconductor layer 404a having such a thickness, the distance from the interface between the base insulating layer 402 and the oxide semiconductor layer 404a to the oxide semiconductor layer 404b where the channel is formed can be greater than or equal to 20 nm, preferably greater than or equal to 30 nm, further preferably greater than or equal to 40 nm, still further preferably greater than or equal to 60 nm. Note that since the productivity of a semiconductor device might be reduced, the thickness of the oxide semiconductor layer 404a is set to be less than or equal to 200 nm, preferably less than or equal to 120 nm, further preferably less than or equal to 80 nm.

For example, the concentration of silicon in a region between the oxide semiconductor layer 404b and the oxide semiconductor layer 404a measured by SIMS is set to be lower than $1\times10^{19}$ atoms/cm$^3$, preferably lower than $5\times10^{18}$ atoms/cm$^3$, further preferably lower than $2\times10^{18}$ atoms cm$^3$. The concentration of silicon in a region between the oxide semiconductor layer 404b and the oxide semiconductor layer 404c measured by SIMS is set to be lower than $1\times10^{19}$ atoms/cm$^3$, preferably lower than $5\times10^{18}$ atoms/cm$^3$, further preferably lower than $2\times10^{18}$ atoms/cm$^3$.

It is preferable to reduce the concentration of hydrogen in the oxide semiconductor layer 404a and the oxide semiconductor layer 404c in order to reduce the concentration of hydrogen in the oxide semiconductor layer 404b. The concentration of hydrogen in the oxide semiconductor layer 404a and the oxide semiconductor layer 404c measured by SIMS is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the oxide semiconductor layer 404a and the oxide semiconductor layer 404c in order to reduce the concentration of nitrogen in the oxide semiconductor layer 404b. The concentration of nitrogen in the oxide semiconductor layer 404a and the oxide semiconductor layer 404c measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The above three-layer structure is an example of the semiconductor layer 404. For example, a two-layer structure without the oxide semiconductor layer 404a or the oxide semiconductor layer 404c may be employed.

As the source electrode layer 406a and the drain electrode layer 406b illustrated in FIGS. 2A and 2B, a conductive layer capable of extracting oxygen from the oxide semiconductor layer is preferably used. As an example of the conductive layer capable of extracting oxygen from the oxide semiconductor layer, a conductive layer containing aluminum, titanium, chromium, nickel, molybdenum, tantalum, tungsten, or the like can be given.

By the conductive layer capable of extracting oxygen from the oxide semiconductor layer, oxygen in the oxide semiconductor layer is released to form oxygen vacancies in the oxide semiconductor layer in some cases. Oxygen is more likely to be extracted as the temperature is higher. Since the manufacturing process of the transistor involves some heat treatment steps, the above phenomenon is likely to cause formation of oxygen vacancies in a region of the oxide semiconductor layer, which is in contact with the source electrode layer or the drain electrode layer. Furthermore, hydrogen enters sites of oxygen vacancies by heating, and thus the oxide semiconductor layer becomes n-type in some cases. Thus, due to the source electrode layer and the drain electrode layer, the resistance of a region where the oxide semiconductor layer is in contact with the source electrode layer or the drain electrode layer is reduced, so that the on-state resistance of the transistor be reduced.

In the case where a transistor with a short channel length (e.g., less than or equal to 200 nm, or less than or equal to 100 nm) is manufactured, a source and a drain might be short-circuited due to formation of an n-type region. Therefore, in the case where a transistor with a short channel length is manufactured, a conductive layer capable of appropriately extracting oxygen from an oxide semiconductor layer may be used as the source electrode layer and the drain electrode layer. As the conductive layer capable of appropriately extracting oxygen, a conductive layer containing nickel, molybdenum, or tungsten can be used, for example.

Furthermore, in the case where a transistor with an extremely short channel length (less than or equal to 40 nm, or less than or equal to 30 nm) is manufactured, a conductive layer which is less likely to extract oxygen from an oxide semiconductor layer may be used as the source electrode layer 406a and the drain electrode layer 406b. As an example of the conductive layer which is less likely to extract oxygen from an oxide semiconductor layer, a conductive layer containing tantalum nitride, titanium nitride, or ruthenium can be given. Note that plural kinds of conductive layers may be stacked.

The gate electrode layer 410 may be formed using a conductive layer containing one or more of aluminum, titanium, chromium, cobalt, nickel, copper, yttrium, zirconium, molybdenum, ruthenium, silver, tantalum, tungsten, and the like.

The insulating layer 412 can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

The transistor illustrated in FIGS. 2A to 2C is a transistor with improved reliability whose threshold voltage is controlled by the gate insulating layer 408a and the gate insulating layer 408b.

[Manufacturing Method Example]

Next, an example of a method for manufacturing the transistor is described with reference to FIGS. 3A to 3C and FIGS. 4A to 4C.

Figure 3A:
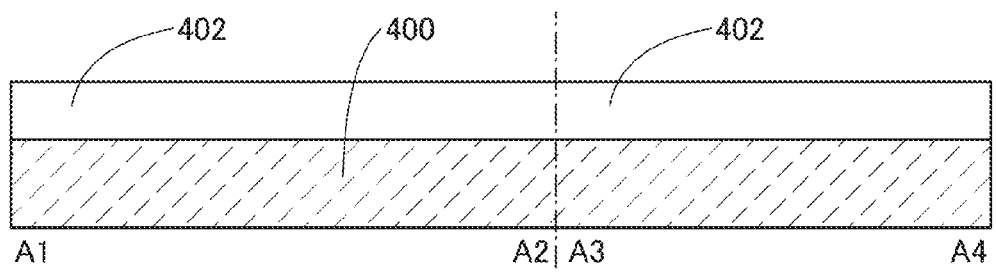
FIGS. 3A to 3C illustrate an example of a method for manufacturing a semiconductor device of one embodiment.

First, the base insulating layer 402 is formed over the substrate 400 (see FIG. 3A).

The base insulating layer 402 may be formed by a sputtering method, a CVD method, a molecular beam epitaxy (MBE) method, an ALD method, or a pulsed laser deposition (PLD) method.

Then, in order to planarize the surface of the base insulating layer 402, CMP treatment may be performed. By CMP treatment, the average surface roughness (Ra) of the base insulating layer 402 is less than or equal to 1 nm, preferably less than or equal to 0.3 nm, more preferably less than or equal to 0.1 nm. In some cases, Ra that is less than or equal to the above value can increase the crystallinity of the oxide semiconductor layer 404. Ra can be measured using an atomic force microscope (AFM).

Then, oxygen may be added to the base insulating layer 402 so that an insulating layer containing excess oxygen can be formed. Oxygen may be added by plasma treatment, an ion implantation method, or the like. In the case where the addition of oxygen may be performed by an ion implantation method, the acceleration voltage may be higher than or equal to 2 kV and lower than or equal to 100 kV and the dose is greater than or equal to $5 \times 10^{14}$ ions/cm$^2$ and less than or equal to $5 \times 10^{16}$ ions/cm$^2$, for example.

Figure 3B:
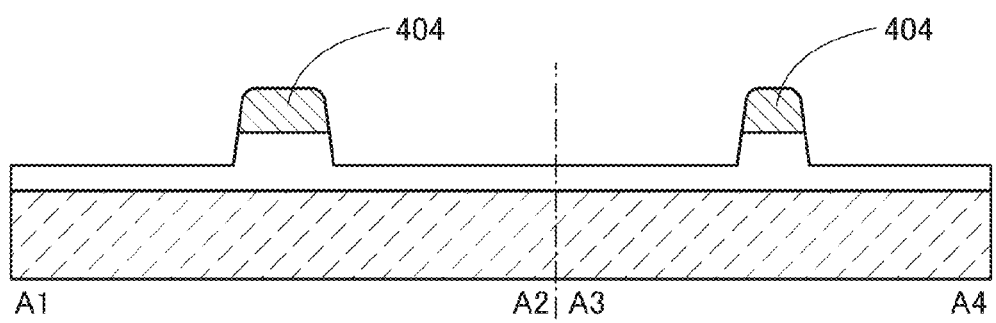

Next, the oxide semiconductor layer 404 is formed over the base insulating layer 402 by a sputtering method, a CVD method, an MBE method, an ALD method, or a PLD method (see FIG. 3B). At this time, the base insulating layer 402 may be appropriately etched. By etching the base insulating layer 402 appropriately, the gate electrode layer 410 to be formed later can cover the oxide semiconductor layer 404 easily. Note that in order to miniaturize the transistor, a hard mask may be used in processing the oxide semiconductor layer 404.

Furthermore, in the case where a stacked layer including the oxide semiconductor layer 404a, the oxide semiconductor layer 404b, and the oxide semiconductor layer 404c is formed as the oxide semiconductor layer 404, it is preferable that the layers be successively formed without exposure to the air.

In order to suppress entry of impurities to form an oxide semiconductor layer having high crystallinity, the oxide semiconductor layer 404 is formed at a substrate temperature of higher than or equal to 100° C., preferably higher than or equal to 150° C., more preferably higher than or equal to 200° C. As an oxygen gas or an argon gas used as a deposition gas, a highly purified gas whose dew point is lower than or equal to −40° C., preferably lower than or equal to −80° C., more preferably lower than or equal to −100° C. is used. The state in which impurity concentration is low and density of defect states is low (the number of oxygen vacancies is small) is referred to as "highly purified intrinsic" or "substantially highly purified intrinsic".

First heat treatment may be performed after the oxide semiconductor layer 404 is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404 can be increased, and in addition, impurities such as hydrogen and water can be removed from the base insulating layer 402.

Figure 3C:
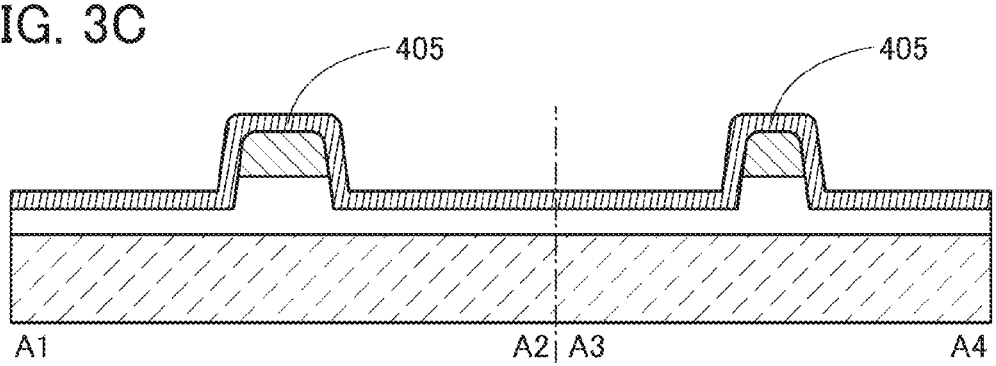

Next a conductive film 405 to be the source electrode layer 406a and the drain electrode layer 406b is formed over the oxide semiconductor layer 404 (see FIG. 3C). The conductive film 105 may be formed by a sputtering method, a CVD method, an MBE method, an ALD method, or a PLD method.

Figure 4A:
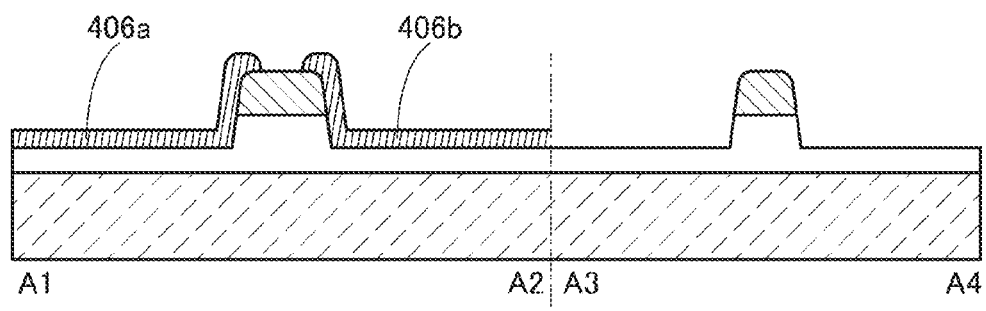
FIGS. 4A to 4C illustrate an example of a method for manufacturing a semiconductor device of one embodiment.

Next, the conductive film 405 is divided by etching to form the source electrode layer 406a and the drain electrode layer 406b (see FIG. 4A). Note that when the conductive film 405 is etched, end portions of the source electrode layer 406a and the drain electrode layer 406b are rounded (have curved surfaces) in some cases. Furthermore, when the conductive film 405 is etched, the base insulating layer 402 may be etched appropriately.

Next, the gate insulating layer 408a is formed over the oxide semiconductor layer 404, the source electrode layer 106a, and the drain electrode layer 406b. The gate insulating layer 408a. may be formed by a sputtering method, a CVD method, or an ALD method.

In particular, a CVD method is preferably used to form the gate insulating layer 408a. In that case, the ratio of the flow rate of a gas containing nitrogen in a deposition gas is made small; thus, the gate insulating layer 408a with significantly reduced nitrogen content can be formed. Note that the gate insulating layer 408a is formed at a substrate temperature of higher than or equal to 100° C., preferably higher than or equal to 150° C., which enables reduction in entry of water.

Next, the gate insulating layer 408b is formed over the gate insulating layer 108a. The gate insulating layer 408b may be formed by a sputtering method, a CVD method, or an ALD method. In particular, the gate insulating layer 408b is preferably formed by a sputtering method or an ALD method. Note that the gate insulating layer 408b is formed at a substrate temperature of higher than or equal to 100° C., preferably higher than or equal to 150° C., which enables reduction in entry of water.

Next, second heat treatment may be performed. The second heat treatment may be performed at a temperature lower than 500° C., preferably lower than 400° C., in an inert gas atmosphere, an atmosphere containing an oxidizing gas at 10 ppm or more, or a reduced pressure state. Alternatively, the second heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the second heat treatment, impurities such as hydrogen and water can be removed from the gate insulating layer 408b.

Figure 4B:
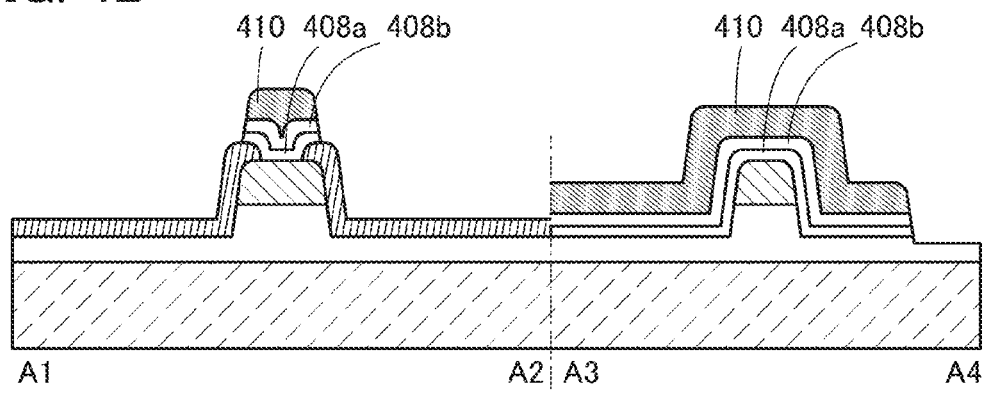

Next, the gate electrode layer 410 is formed over the gate insulating layer 408b (see FIG. 4B).

Figure 4C:
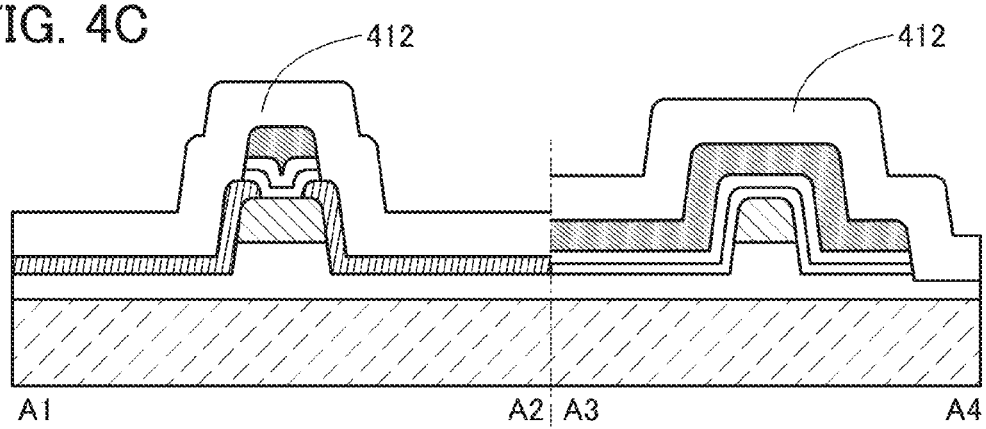

Next, the insulating layer 412 is formed over the source electrode layer 406a, the drain electrode layer 406b, the gate insulating layer 408a, the gate insulating layer 408b, and the gate electrode layer 410 (see FIG. 4C). The insulating layer 412 may be formed by a sputtering method, a CVD method, an MBE method, an ALD method, or a PLD method.

Next, second heat treatment may be performed. The second heat treatment can be performed under conditions similar to those of the first heat treatment. The second heat treatment allows reducing oxygen vacancies in the oxide semiconductor layer 404 in some cases.

Through the above steps, the transistor illustrated in FIGS. 2A to 2C can be manufactured.

[Deposition Apparatus]

A deposition apparatus which can be used for forming a semiconductor layer, an insulating layer, a conductive layer, and the like to be described in any of the above is described below.

In a conventional deposition apparatus utilizing a CVD method, one or a plurality of source material gases for reaction are supplied to a chamber at the same time at the time of deposition. In a deposition apparatus utilizing an ALD method, source material gases for reaction are sequentially introduced into a chamber, and then the sequence of the gas introduction is repeated. For example, two or more kinds of source material gases are sequentially supplied to the chamber by switching respective switching valves (also referred to as high-speed valves). For example, a first source material gas is introduced, an inert gas (e.g., argon or nitrogen) or the like is introduced after the introduction of the first gas so that the source material gases are not mixed, and then a second source material gas is introduced. Alternatively, the first source material gas may be exhausted by vacuum evacuation instead of the introduction of the inert gas, and then the second source material gas may be introduced. The first source material gas is adsorbed on a surface of the substrate to form a first single-atomic layer; then the second source material gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor Furthermore, plasma damage is not caused when an ALD method is employed.

Figure 8A:
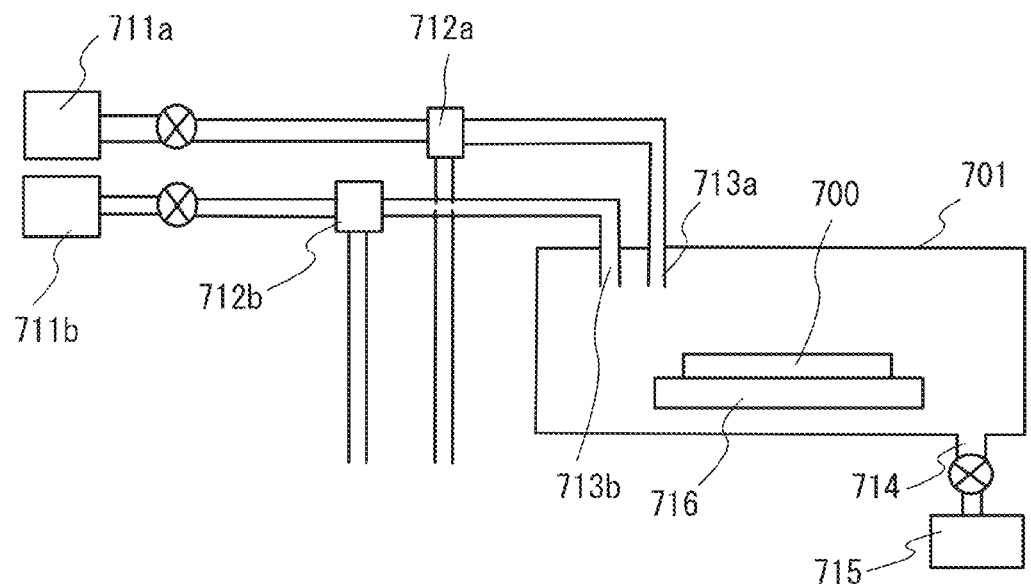
FIGS. 8A and 8B illustrate a structure example of a deposition apparatus of one embodiment.

FIG. 8A illustrates an example of a deposition apparatus utilizing an ALD method. The deposition apparatus utilizing an ALD method includes a deposition chamber (chamber 701), source material supply portions 711a and 711b, high-speed valves 712a and 712b which are flow rate controllers, source material introduction ports 713a and 713b, a source material exhaust port 714, and an evacuation unit 715. The source material introduction ports 713a and 713b provided in the chamber 701 are connected to the source material supply portions 711a and 711b, respectively, through supply tubes and valves. The source material exhaust port 714 is connected to the evacuation unit 715 through an exhaust tube, a valve, and a pressure controller.

A substrate holder 716 with a heater is provided in the chamber, and a substrate 700 over which a film is formed is provided over the substrate holder.

In the source material supply portions 711a and 711b, a source material gas is formed from a solid source material or a liquid source material by using a vaporizer, a heating unit, or the like. Alternatively, the source material supply portions 711a and 711b may supply a gas source material.

Although two source material supply portions 711a and 711b are provided as an example, without limitation thereto, three or more source material supply portions may be provided. The high-speed valves 712a and 712b can be accurately controlled by time, and supply one of a source material gas and an inert gas. The high-speed valves 712a and 712b are flow rate controllers for a source material gas, and can also be referred to as flow rate controllers for an inert gas.

In the deposition apparatus illustrated in FIG. 8A, a thin film is formed over a surface of the substrate 700 in the following manner: the substrate 700 is transferred to put on the substrate holder 716, the chamber 701 is sealed, the substrate 700 is heated to a desired temperature (e.g., higher than or equal to 100° C. or higher than or equal to 150° C.) by heating the substrate holder 716 with a heater; and supply of a source material gas, evacuation with the evacuation unit 715, supply of an inert gas, and evacuation with the evacuation unit 715 are repeated.

In the deposition apparatus illustrated in FIG. 8A, an insulating layer including an oxide (e.g., a composite oxide) containing one or more elements selected from hafnium, aluminum, tantalum, zirconium, and the like can be formed by selecting a source material (e.g., a volatile organometallic compound) prepared for the source material supply portions 711a and 711b appropriately. Specifically, it is possible to use an insulating layer including hafnium oxide, an insulating layer including aluminum oxide, an insulating layer including hafnium silicate, or an insulating layer including aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) prepared for the source material supply portions 711a and 711b appropriately.

For example, in the case where a hafnium oxide film is formed by a deposition apparatus using an ALD method, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. In this case, the first source material gas supplied from the source material supply portion 711a is TDMAH, and the second source material gas supplied from the source material supply portion 711b is ozone. Note that the chemical formula of tetrakis(dimethylamide)hafnium is $Hf[N(CH_3)_2]_4$. Examples of another material liquid include tetrakis(ethylinemethylamide)hafnium.

For example, in the case where an aluminum oxide film is formed by a deposition apparatus utilizing an ALD method, two kinds of gases, e.g., $H_2O$ as an oxidizer and a source material gas which is obtained by vaporizing liquid containing a solvent and an aluminum precursor compound (e.g., trimethylaluminum (TMA)) are used. In this case, the first source material gas supplied from the source material supply portion 711a is TMA, and the second source material gas supplied from the source material supply portion 711b is $H_2O$. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptadionate).

For example, in the case where a tungsten layer is formed using a deposition apparatus utilizing an ALD method, a $WF_6$ gas and a B$_2$H$_6$ gas are sequentially introduced a plurality of times to form an initial tungsten layer, and then a WF$_6$ gas and an H$_2$ gas are introduced at a time, so that a tungsten layer is formed. Note that an SiH$_4$ gas may be used instead of a B$_2$H$_6$ gas. These gases may be controlled by mass flow controllers.

Figure 8B:
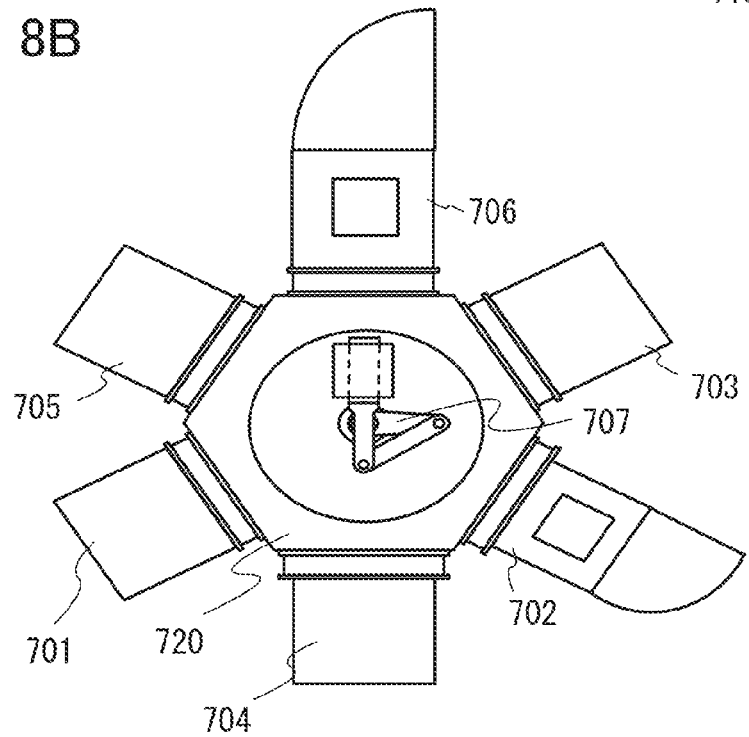

FIG. 8B illustrates an example of a multi-chamber manufacturing apparatus including at least one deposition apparatus illustrated in FIG. 8A.

In the manufacturing apparatus illustrated in FIG. 8B, a stack of films can be successively formed without exposure to the air, and entry of impurities is prevented and throughput is improved.

The manufacturing apparatus illustrated in FIG. 8B includes at least a load chamber 702, a transfer chamber 720, a pretreatment chamber 703, a chamber 701 which is a deposition chamber, and an unload chamber 706. Note that in order to prevent attachment of moisture, the chambers of the manufacturing apparatus (including the load chamber, the treatment chamber, the transfer chamber, the deposition chamber, the unload chamber, and the like) are preferably filled with an inert gas (such as a nitrogen gas) whose dew point is controlled, more preferably maintain reduced pressure.

The chambers 704 and 705 may be deposition apparatuses utilizing an ALD method like the chamber 701, deposition apparatuses utilizing a plasma CVD method, deposition apparatuses utilizing a sputtering method, or deposition apparatuses utilizing a metal organic chemical vapor deposition (MOCVD) method.

For example, an example in which a stack of films is formed under a condition that the chamber 704 is a deposition apparatus utilizing a plasma CVD method and the chamber 705 is a deposition apparatus utilizing an MOCVD method is shown below.

First, a plurality of substrates over each of which an oxide semiconductor layer is provided are set in the load chamber 702. Next, the substrate is transferred to the pretreatment chamber 703 by a transfer unit 707 of the transfer chamber 720. In the pretreatment chamber 703, treatment for cleaning the surface of the substrate is performed. Next, the substrate whose surface is cleaned is transferred to the chamber 704 without exposure to the air, and a silicon oxide layer is formed. Next, the substrate is transferred to the chamber 701 by the transfer unit 707 without exposure to the air, and a hafnium oxide layer is formed. Next, the substrate is transferred to the chamber 705 by the transfer unit 707 without exposure to the air, and a tungsten layer is formed. Then, the substrate is transferred to the unload chamber 706 by the transfer unit 707. Through the above procedure, the silicon oxide layer over the oxide semiconductor layer, the hafnium oxide layer over the silicon oxide layer, and the tungsten layer over the hafnium oxide layer can be formed, for example.

Although the example in which a stacked film is formed using three kinds of deposition apparatuses is described here, there is no limitation thereto. For example, the oxide semiconductor layer 104, the gate insulating layer 108, and the gate electrode layer 110 which are described in Embodiment 1 may be successively formed. Furthermore, layers described in the other embodiments may be formed using the manufacturing apparatus described in this embodiment.

Although FIG. 8B shows an example in which a top surface shape of the transfer chamber 720 is a hexagon, a manufacturing apparatus in which the top surface shape is set to a polygon having more than six corners and more chambers are connected depending on the number of layers of a stack may be used. The top surface shape of the substrate is rectangular in FIG. 8B; however, there no particular limitation on the top surface shape of the substrate. Although FIG. 8B shows an example of the single wafer type, a batch-type deposition apparatus in which a plurality of substrates are formed at a time may be used.

The above is the description of the deposition apparatus.

[Modification Example of Transistor Structure 1]

Figure 5A:
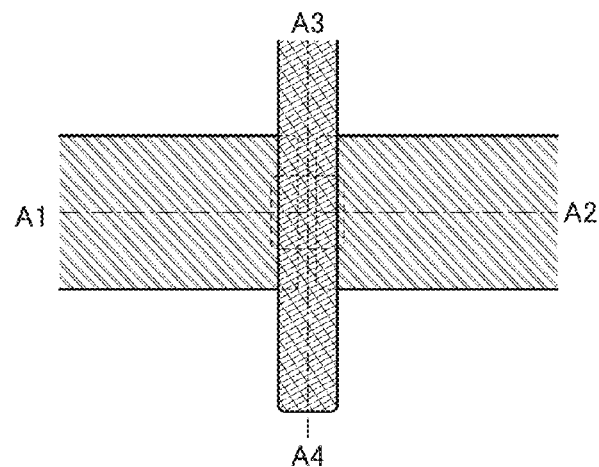
FIGS. 5A and 5B illustrate a structure example of a semiconductor device of one embodiment.
Figure 5B:
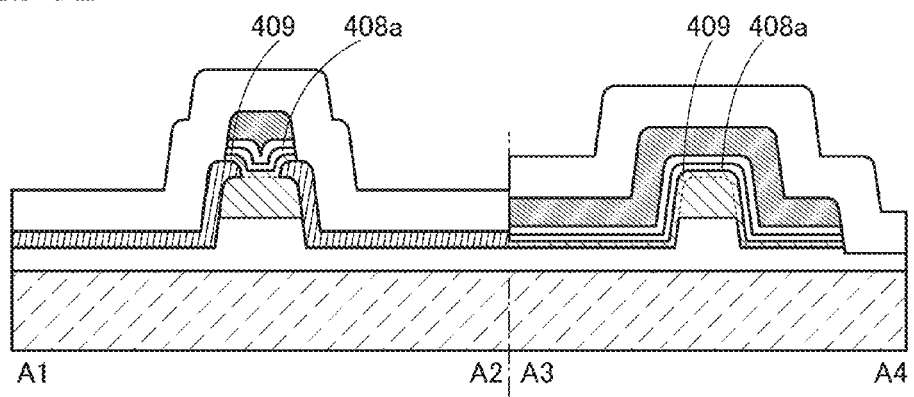

As in a transistor illustrated in FIGS. 5A and 5B, an oxide layer 409 may be provided under the gate insulating layer 408a. As the oxide layer 409, the oxide semiconductor layer shown as the oxide semiconductor layer 404c may be used. Note that the description of the transistor in FIGS. 2A to 2C is referred to for the structures of the other components. Furthermore, in that case, a two-layer structure of the oxide semiconductor layer 404a and the oxide semiconductor layer 404b may be used as the oxide semiconductor layer 404; thus, three layers including the oxide semiconductor layer 409 may be stacked.

<Transistor Structure 2>

Figure 6A:
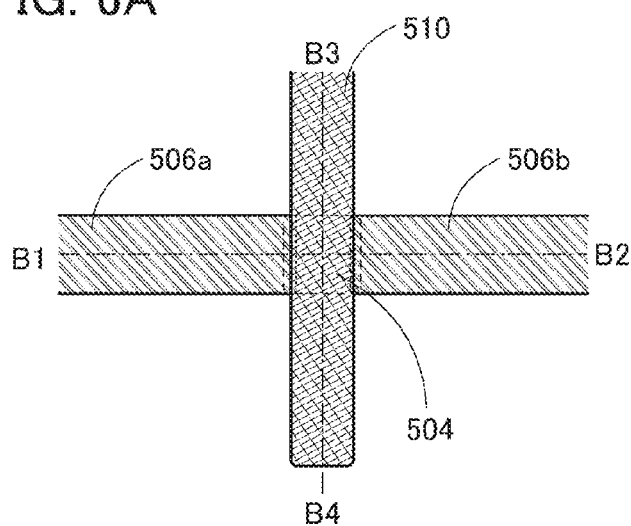
FIGS. 6A and 6B illustrate a structure example of a semiconductor device of one embodiment.
Figure 6B:
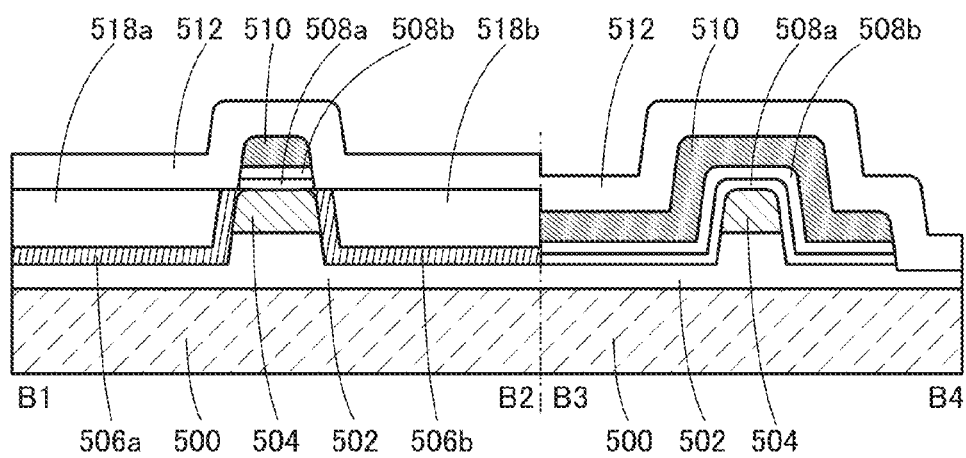

FIGS. 6A and 6B are a top view and a cross-sectional view of a transistor of one embodiment of the present invention. FIG. 6A is a top view and FIG. 6B is a cross-sectional view taken along dashed-dotted line B1-B2 and dashed-dotted line B3-B4 in FIG. 6A. Note that for simplification of the drawing, some components in the top view in FIG. 6A are not illustrated.

The transistor in FIGS. 6A and 6B includes a base insulating layer 502 having a projecting portion over a substrate 500, an oxide semiconductor layer 504 over the projecting portion of the base insulating layer 502, a source electrode layer 506a and a drain electrode layer 506b in contact with side surfaces of the oxide semiconductor layer 504, an insulating layer 518a and an insulating layer 518b which are over the source electrode layer 506a and the drain electrode layer 506b and the levels of the top surfaces of which are the same as that of the oxide semiconductor layer, a gate insulating layer 508a over the oxide semiconductor layer 504, the source electrode layer 506a, and the drain electrode layer 506b, a gate insulating layer 508b over the gate insulating layer 508a, a gate electrode layer 510 which is in contact with a top surface of the gate insulating layer 508b and faces a top surface and the side surfaces of the oxide semiconductor layer 504, and an insulating layer 512 over the source electrode layer 506a, the drain electrode layer 506b, and the gate electrode layer 510. Note that the base insulating layer 502 does not necessarily include a projecting portion.

In the transistor illustrated in FIGS. 6A and 6B, the source electrode layer 506a or the drain electrode layer 506b are provided to be in contact with mainly side surfaces of the oxide semiconductor layer 504. Therefore, an electric field applied from the gate electrode layer 510 to the oxide semiconductor layer 504 is less likely to be prevented by the source electrode layer 506a and the drain electrode layer 506b. Thus, the current path in the oxide semiconductor layer can be wider than that in the transistors illustrated in FIGS. 2A to 2C and FIGS. 5A and 5B, and a higher on-state current can be obtained.

Furthermore, since the level of the top surface of the oxide semiconductor layer 504, that of the insulating layer 518a, and that of the insulating layer 518b are the same, shape defects do not easily occur. Therefore, a semiconductor device including the transistor can be manufactured with high yield.

Note that for the insulating layer 518a and the insulating layer 518b, the description of the base insulating layer 402 is referred to.

For the substrate 500, the description of the substrate 400 is referred to. For the base insulating layer 502, the description of the base insulating layer 402 is referred to. For the oxide semiconductor layer 504, the description of the oxide semiconductor layer 404 is referred to. For the source electrode layer 506a and the drain electrode layer 506b, the description of the source electrode layer 406a and the drain electrode layer 406b is referred to. For the gate insulating layer 508a, the description of the gate insulating layer 408a is referred to. For the gate insulating layer 508b, the description of the gate insulating layer 408b is referred to. For the gate electrode layer 510, the description of the gate electrode layer 410 is referred to. For the insulating layer 512, the description of the insulating layer 412 is referred to.

<Modification Example of Transistor Structure 2>

As in the transistor illustrated in FIGS. 6A and 6B, an oxide layer may be provided under the gate insulating layer 508a. For the oxide layer, the description of the oxide layer 409 is referred to. Note that the description of the transistor illustrated in FIGS. 6A and 6B is referred to for the structures of the other components.

<Transistor Structure 3>

Figure 7A:
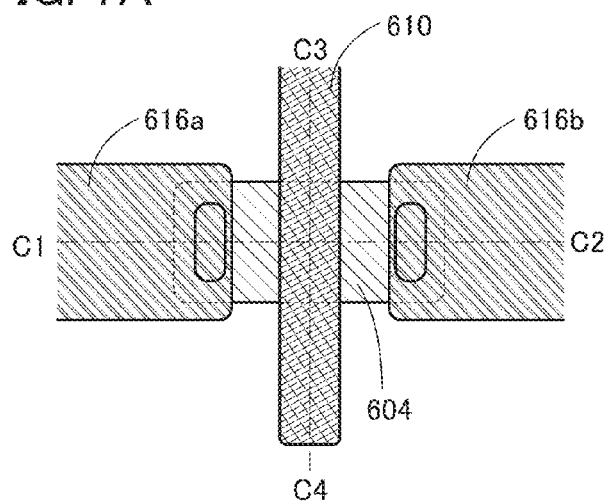
FIGS. 7A and 7B illustrate a structure example of a semiconductor device of one embodiment.
Figure 7B:
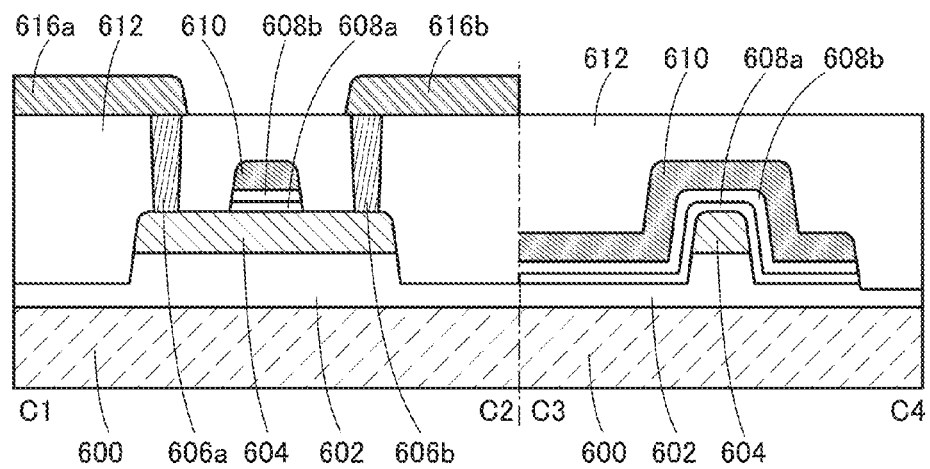

FIGS. 7A and 7B are a top view and a cross-sectional view of a transistor of one embodiment of the present invention. FIG. 7A is a top view and FIG. 7B is a cross-sectional view taken along dashed-dotted line C1-C2 and dashed-dotted line C3-C4 in FIG. 7A. Note that for simplification of the drawing, some components in the top view in FIG. 7A are not illustrated.

The transistor illustrated in FIGS. 7A and 7B includes a base insulating layer 602 having a projecting portion over a substrate 600, an oxide semiconductor layer 604 over the projecting portion of the base insulating layer 602, a gate insulating layer 608a over the oxide semiconductor layer 604, a gate insulating layer 608b over the gate insulating layer 608a, a gate electrode layer 610 which is in contact with a top surface of the gate insulating layer 608b and faces a top surface and side surfaces of the oxide semiconductor layer 604, an insulating layer 612 which is over the oxide semiconductor layer 604 and the gate electrode layer 610 and includes openings reaching the oxide semiconductor layer 604, a source electrode layer 606a and a drain electrode layer 606b which fill the openings, and a wiring layer 616a and a wiring layer 616b in contact with the source electrode layer 606a and the drain electrode layer 606b, respectively. Note that the base insulating layer 602 does not necessarily include a projecting portion.

In the transistor in FIGS. 7A and 7B, the source electrode layer 606a and the drain electrode layer 606b are provided so as not to overlap with the gate electrode layer 610. Thus, parasitic capacitance generated between the gate electrode layer 610 and the source electrode layer 606a or the drain electrode layer 606b can be reduced. For this reason, the transistor in FIGS. 7A and 7B can have excellent switching characteristics.

Since the level of the top surface of the insulating layer 612, that of the source electrode layer 606a, and that of the drain electrode layer 606b are the same, shape defects do not easily occur. Therefore, a semiconductor device including the transistor can be manufactured with high yield.

Note that for the wiring layer 616a and the wiring layer 616b, the description of the gate electrode layer 410 is referred to.

For the substrate 600, the description of the substrate 400 is referred to. For the base insulating layer 602, the description of the base insulating layer 402 is referred to. For the oxide semiconductor layer 604, the description of the oxide semiconductor layer 404 is referred to. For the source electrode layer 606a and the drain electrode layer 606b, the description of the source electrode layer 406a and the drain electrode layer 406b is referred to. For the gate insulating layer 608a, the description of the gate insulating layer 408a. is referred to. For the gate insulating layer 608b, the description of the gate insulating layer 408b is referred to. For the gate electrode layer 610, the description of the gate electrode layer 410 is referred to. For the insulating layer 612, the description of the insulating layer 412, is referred to.

[Modification Example of Transistor Structure 3]

As in the transistor illustrated in FIGS. 7A and 7B, an oxide layer may be provided under the gate insulating layer 608a. For the oxide layer, the description of the oxide layer 409 is referred to. Note that the description of the transistor illustrated in FIGS. 7A and 7B is referred to for the structures of the other components.

At least part of this embodiment can be implemented in combination with any of the other embodiments described in this specification as appropriate.

Embodiment 3

In this embodiment, an insulating layer in contact with a semiconductor layer is focused, and a factor causing a deterioration in transistor characteristics is described. As an insulating layer in contact with a semiconductor layer, an insulating layer functioning as a gate insulating layer, and an insulating layer used to protect a semiconductor layer on the back channel side can be given, for example.

In the case where an insulating layer is provided to be in contact with a semiconductor layer in which a channel of a transistor is formed and impurities or defects exist inside the insulating layer or an interface between the semiconductor layer and the insulating layer, the impurities or defects might function as carrier traps. Such carrier traps cause a reduction or variation in electrical characteristics of the transistor, which is a factor for reducing the reliability.

Factors of deterioration in characteristics of a transistor are described below, relating to the following two cases: a case of focusing attention on an element or defect contained in an insulating layer in contact with a semiconductor layer; and a case of focusing attention on an element or defect contained in an interface between the semiconductor layer and the insulating layer.

<Effect of Insulating Layer>

A relation between components contained in the insulating layer in contact with the semiconductor layer and a deterioration in characteristics of a transistor is described.

<Results of Stress Test of Transistor>

First, three kinds of transistors are formed under different conditions of depositing an insulating layer in contact with a semiconductor layer, and results of the transistor characteristics compared between before and after a stress test.

Figure 9:
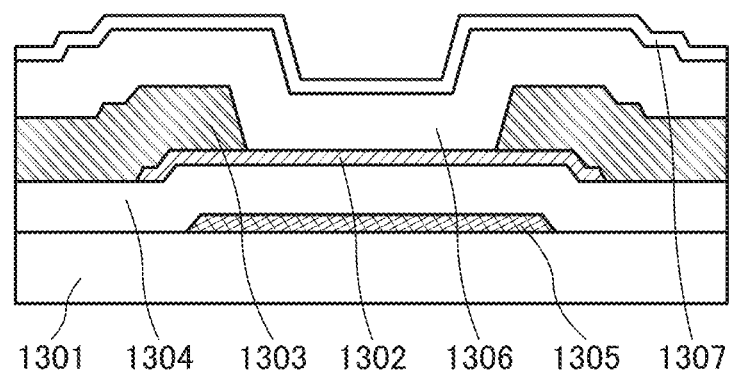
FIG. 9 illustrates a structure example of a semiconductor device of one embodiment.

FIG. 9 is a schematic cross-sectional view of a transistor in the channel length direction. The transistor has an inverted staggered structure provided over a substrate 1301. The transistor includes a gate electrode 1305 over the substrate 1301, a gate insulating layer 1304 covering the gate electrode 1305, a semiconductor layer 1302 including an oxide semiconductor over the gate insulating layer 1304, a pair of electrodes 1303 functioning as a source electrode and a drain electrode over the semiconductor layer 1302, a first insulating layer 1306 covering the electrodes 1303 and the semiconductor layer 1302, and a second insulating layer 1307 over the insulating layer 1306, As an oxide semiconductor included in the semiconductor layer 1302, an oxide semiconductor formed by a sputtering method with use of an In—Ga—Zn—O based material (In:

Ga:Zn=1:1:1) for a sputtering target (hereinafter, the formed oxide semiconductor is also referred to as IGZO (1:1:1)) was used. As the first insulating layer 1306 in contact with the semiconductor layer 1302, silicon oxide containing nitrogen (hereinafter, also referred to as silicon oxynitride, SiON) formed by a plasma CVD method is used. To form three kinds of transistors, the deposition condition of the first insulating layer 1306 was changed.

Note that in this specification, a "silicon oxynitride film (SiON film)" refers to a film that includes more oxygen than nitrogen, and a "silicon nitride oxide film (SiNO film)" refers to a film that includes more nitrogen than oxygen.

Figure 10:
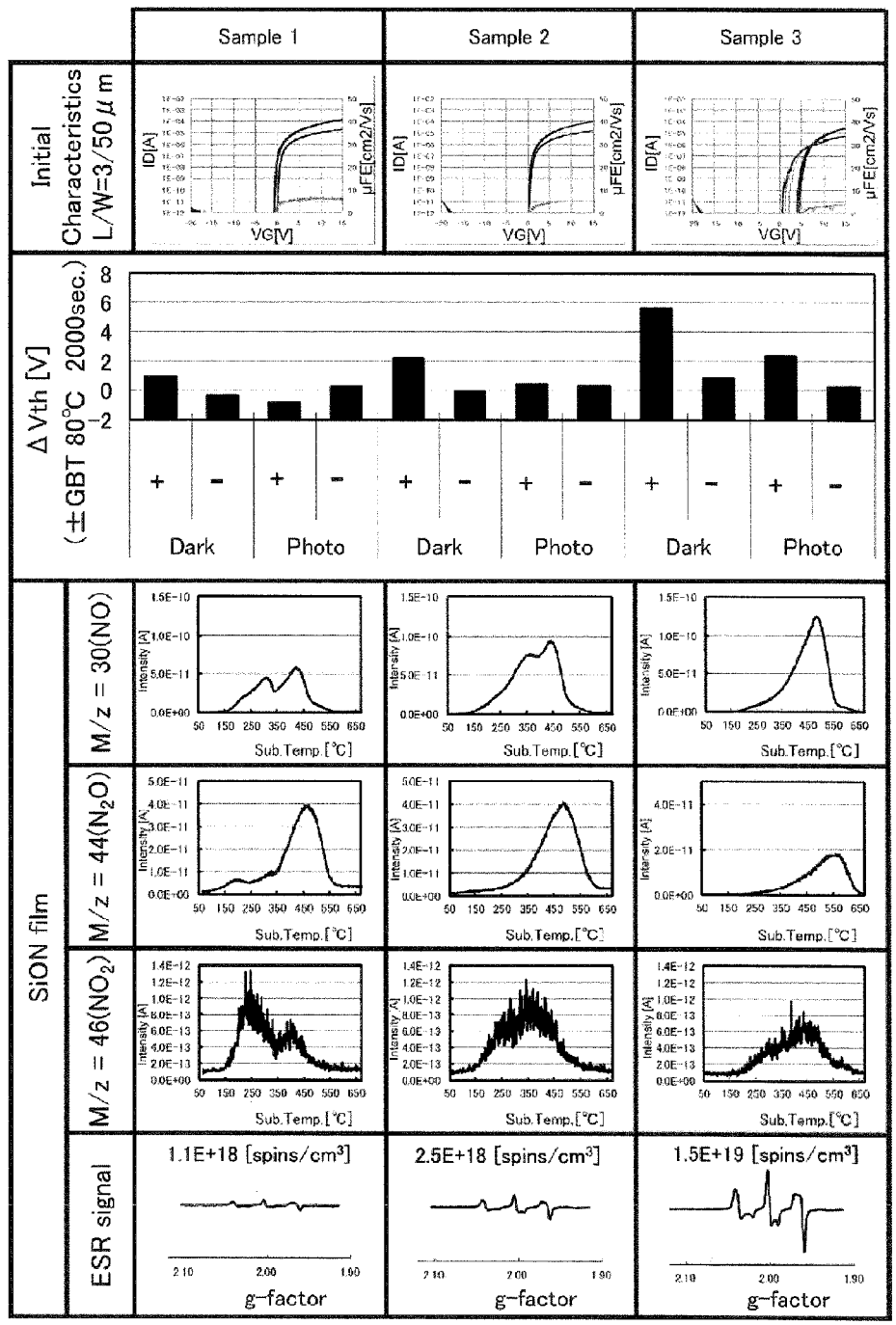
FIG. 10 shows characteristics of transistors, analysis results of TDS measurement, and ESR signals of one embodiment.

FIG. 10 shows results of measurement to which three kinds of transistors (Samples 1 to 3) were subjected. The results indicate initial $I_d$-$V_g$ characteristics, a variation in threshold voltage ($\Delta V_{th}$) before and after the stress test, analysis results of thermal desorption spectroscopy (TDS) to which the first insulating layer was subjected, and signals obtained by electron spin resonance (ESR) to which the first insulating layer was subjected, in this order from the top of the drawing.

As for the TDS analysis and the ESR measurement, samples were independently formed in order to evaluate the three kinds of silicon oxynitride films themselves deposited under different conditions. Each sample for evaluation using a single film was formed by depositing a silicon oxynitride film over a quartz substrate.

As the TDS analysis results, NO (mass-to-charge ratio (M/z)=30), $N_2O$ (M/z=44), and $NO_2$ (M/z=46) are shown in this order in FIG. 10. As shown in the TDS analysis results, among the gases released from the oxynitride film, the amount of released NO has a difference between the samples. Sample 1 has the smallest amount of released NO, and Sample 3 has the largest amount of released NO.

ESR signals split in three, which appear around g (g-factor))=2.001 in FIG. 10, are considered to be signals attributed to $NO_2$ in $SiO_2$. According to FIG. 10, Sample 1 has the lowest ESR signal intensity and the lowest spin density calculated from the ESR signal, and Sample 3 has the highest ESR signal intensity and the highest spin density, which are similar to the case of TDS analysis results.

As the stress test, a gate bias-temperature stress test (GBT test) was employed. The GBT test is a kind of accelerated test, which enables a change in characteristics caused by long-term usage of transistors to be examined in a short time. The GBT test was conducted under the following conditions: a substrate over which a transistor was formed was held at 80° C.; 0 V was applied to a source and a drain of the transistor; and 30 V or –30 V was applied to a gate so that the electric field intensity applied to a gate insulating layer became 1.65 MV/cm or –1.65 MV/cm. The conditions were kept for 2000 seconds. Here, a test in which a positive voltage is applied to the gate is referred to as a positive GBT, and a test in which a negative voltage is applied to the gate is referred to as a negative GBT. In addition, in FIG. 10, "Dark" indicates a condition where stress is applied in a dark state, and "Photo" indicates a condition where stress is applied in an irradiation state of white LED light with 3000 lx.

According to FIG. 10, in the case of the positive GBT test, the amount of change in the threshold voltage in the positive direction differs between the samples in both of the conditions of "Dark" and "Photo". Sample 1 has the smallest amount of change, and Sample 3 has the largest amount of change.

The above results indicate that as the amount of released NO from the insulating layer in contact with the semiconductor layer and the spin density calculated from the ESR signal are increased, the amount of change in the threshold voltage of the transistor in the positive direction is increased.

Since the signal of ESR means existence of lone electrons, it is indicated that the insulating layer used in Sample 3 has the largest number of lone electrons. The lone electron serves as an electron trap or a hole trap in accordance with the energy position in some cases. Thus, the above results strongly suggest that the dangling bonds of defects associated with N in the insulating layer in contact with the semiconductor layer is one of factors causing a change in the threshold voltage in the positive direction in the positive GBT stress of the transistor.

[Transition Level of Nitrogen Compound in the Insulating Layer]

In view of the above results, the defect states in the silicon oxynitride (SiON) and ESR signals thereof were verified by calculation. Specifically, models in which $NO_2$, $N_2O$, NO, and N atoms were introduced into the respective silicon oxide ($SiO_2$) were formed, and the transition levels thereof were examined to verify whether the atoms introduced into silicon oxide serve as electron traps of the transistor.

Figure 11:
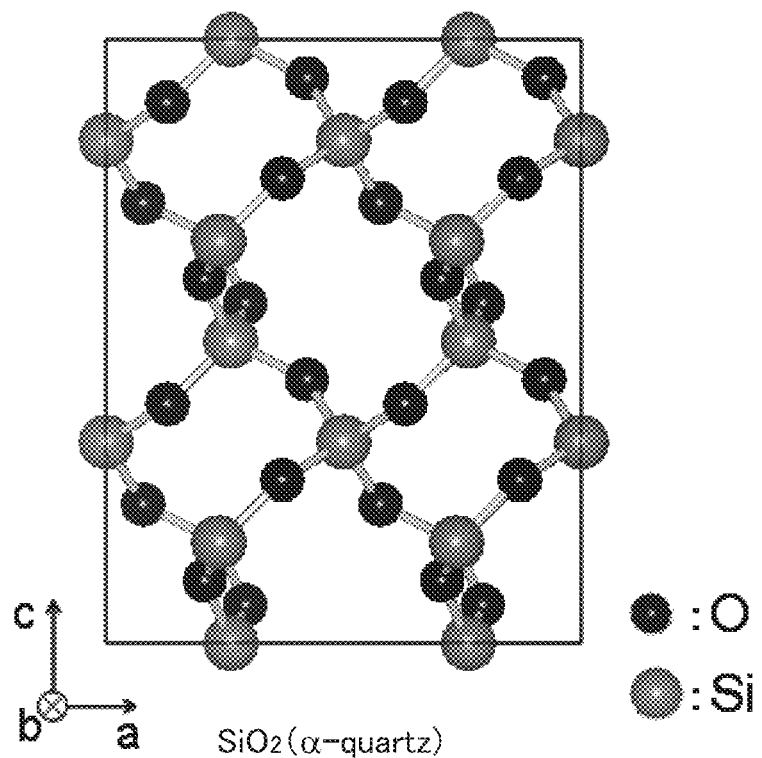
FIG. 11 shows a crystal model of c-SiO$_2$ of one embodiment.

In calculation, $SiO_2$ (c-$SiO_2$) with a low-temperature quartz (α-quartz) crystal structure was used as a model. A crystal model of c-$SiO_2$ without defects is shown in FIG. 11.

First, structure optimization calculation was performed on a model including 72 atoms, particularly on the lattice constants and the atomic coordinates. The model was obtained by doubling the unit cells in all axis directions of c-$SiO_2$. In the calculation, first principles calculation software VASP (the Vienna Ab initio Simulation Package) was used. The effect of inner-shell electron was calculated by a Projector Augmented Wave (PAW) method, and as a functional, Heyd-Scuseria-Ernzerhof (HSE) DFT hybrid functional (HSE06) was used. The calculation conditions are as follows.

TABLE 1

| Calculation Conditions | |
|---|---|
| Software | VASP |
| Functional | HSE06 |
| Mixing ratio of exchange term | 0.4 |
| Pseudopotential | PAW method |
| Cut-off energy | 800 eV |
| k-point | 1 × 1 × 1 (optimization) |
|  | 2 × 2 × 2 (total energy) |

The band gap of c-$SiO_2$ model after the structure optimization was 8.97 eV that is close to the experimental value, 9.0 eV.

Next, $NO_2$, $N_2O$, NO, and an N atom were respectively introduced into space (interstice) in a crystal structure of the above c-$SiO_2$ model to prepare respective models. Then, the structure optimization calculation was performed on the models. The structure optimization calculation was performed on each model with respect to the following three cases: a case where the whole system is positive monovalent (charge: +1); a case where the whole system is electrically neutral (zerovalent) (charge: neutral); and a case where the whole system is negative monovalent (charge: –1). Note that in the ground state of electrons, the charges imposed on the whole system were localized in defects each including respective $NO_2$, $N_2O$, NO, and N atoms.

Figure 12:
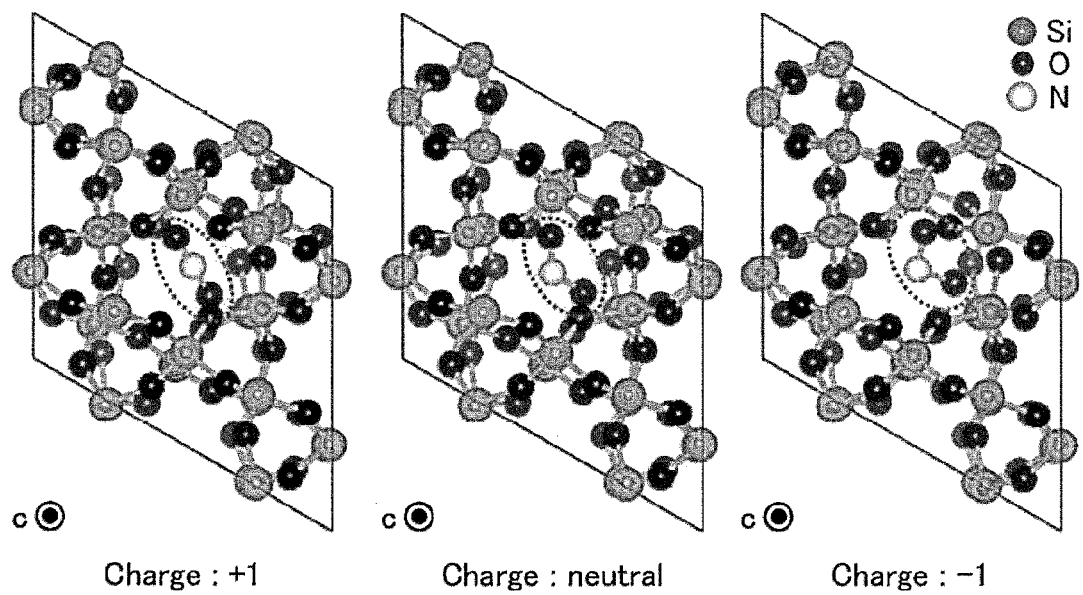
FIG. 12 shows atomic arrangements and structure parameters after structure optimization of one embodiment.

As for the model in which $NO_2$ was introduced into an interstice in the c-$SiO_2$ model, a structure after the structure optimization calculation was performed and a structural parameter of an $NO_2$ molecule are shown in FIG. 12.

Note that the molecule that is not electrically neutral is frequently called a molecular ion; however, unlike an isolated system, it is difficult to quantitate the valence of molecule because the molecular discussed here is a molecular introduced inside a crystal lattice. Thus, a molecule that is not electrically neutral is also called molecular for convenience.

FIG. 12 shows that when an $NO_2$ molecule is introduced, the $NO_2$ molecule tends to be in a linear arrangement in the case where the charge of system is +1, and that the descending order of reducing the angle of the O—N—O bond is the case where the charge of system is +1, the case where the charge of system is neutral, and the case where the charge of system is −1. This structure change in the $NO_2$ molecule is almost equal to a change in the bonding angle when the charge number of isolated molecules in a gas phase varies. Thus, it is suggested that almost the assumed charges are attributed to the $NO_2$ molecule, and the $NO_2$ molecule in $SiO_2$ exists in a state close to an isolated molecule.

Figure 13:
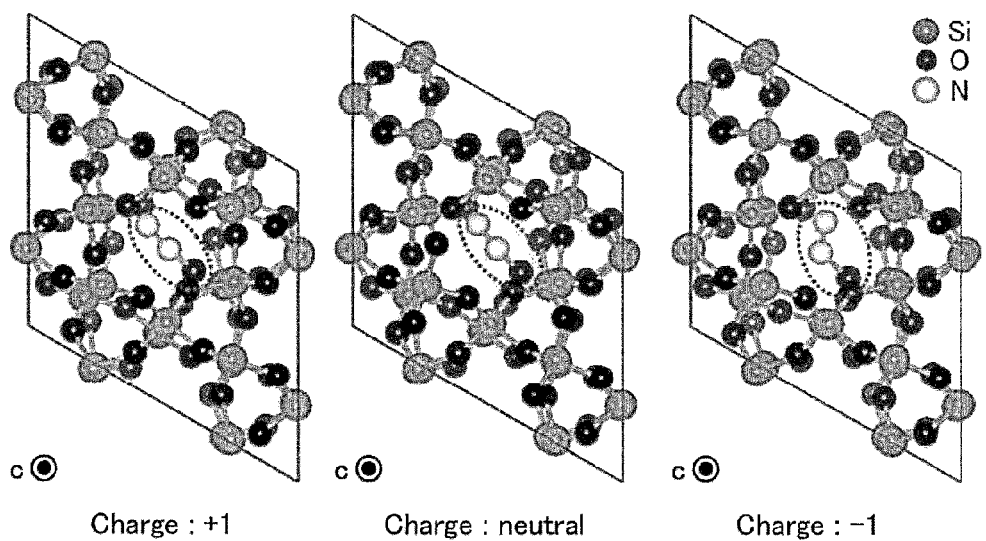
FIG. 13 shows atomic arrangements and structure parameters after structure optimization of one embodiment.

Next, as for the model in which $N_2O$ was introduced into the interstice in the $c$-$SiO_2$ model, a structure after the structure optimization calculation was performed and a structural parameter of an $N_2O$ molecule are shown in FIG. 13.

According to FIG. 13, in the case where the charge of system is +1 and the case where the charge is neutral, the structures of $N_2O$ molecules are in the almost same linear arrangement, which means the two cases have almost the same structure. In contrast, in the case where the charge of system is —I, the $N_2O$ molecule has a bent shape, and the distance between N and O is longer than those of the above two cases. This conceivable reason is that an electron enters the LUMO level that is $\pi^*$ orbital of the $N_2O$ molecule.

Figure 14:
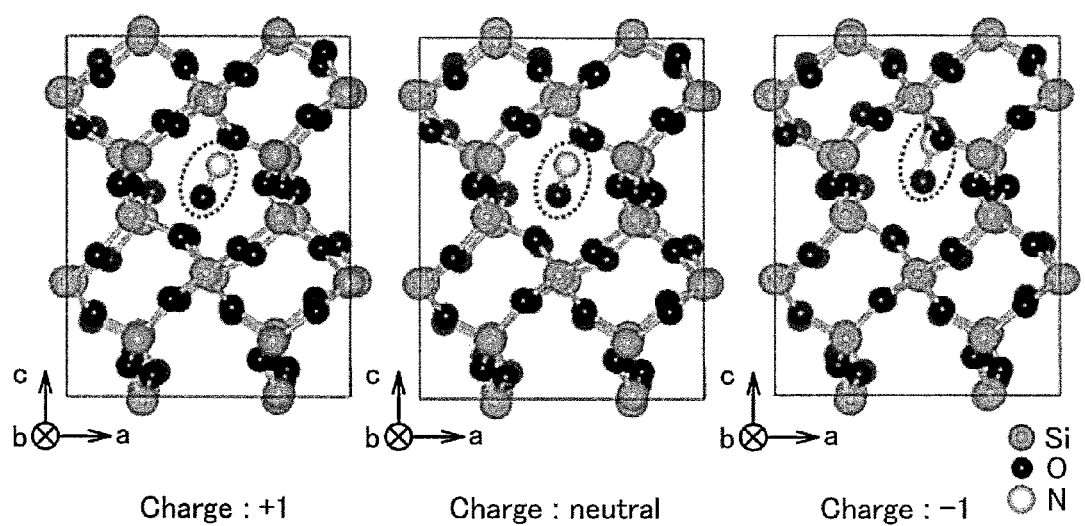
FIG. 14 shows atomic arrangements and structure parameters after structure optimization of one embodiment.

Next as for the model in which NO was introduced into the interstice in the $c$-$SiO_2$ model, a structure after the structure optimization calculation was performed and a structural parameter of an NO molecule are shown in FIG. 14.

According to FIG. 14, the distance between N and O is short in the case where the charge of system is and the distance between N and O is long in the case where the charge of system is −1. It is suggested that this tendency reflect the following: in the case where the charge of the isolated NO molecule is +1, the bond order of the N—O bond is 3.0; in the case where the charge of the isolated NO molecule is 0, the bond order is 2.5; and in the case where the charge of the isolated NO molecule is −1, the bond order is 2.0; thus, the bond order becomes the largest when the charge is +1. Therefore, it is suggested that the NO molecule in $SiO_2$ exist stably in a state close to the isolated molecule.

Figure 15:
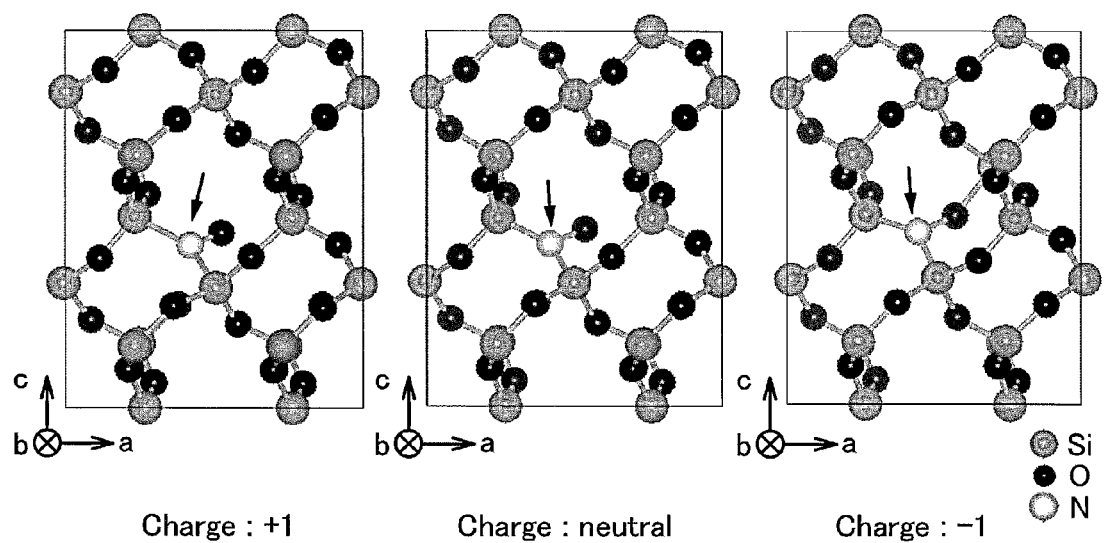
FIG. 15 shows atomic arrangements after structure optimization of one embodiment.

Then, as for the model in which an N atom was introduced into an interstice in the $c$-$SiO_2$ model, a structure after the structure optimization calculation was performed is shown in FIG. 15.

According to FIG. 15, in either charge state (i.e., a state where the charge is +1, neutral, or −1), the N atom that is bonded to atoms in $SiO_2$ is more stable in terms of energy than the N atom existed as an isolated atom in an interstice.

Next, the calculation of a transition level was performed on each model.

The transition level $\epsilon$ (q/q') for transition between the charge q state and the charge q' state in a model having defect D in its structure can be calculated with the following formula.

$$\varepsilon(q/q') = \frac{\Delta E^{q'}}{q' - q}$$ [Formula 1]

$$\Delta E^q = E_{tot}(D^q) - E_{tot}(\text{bulk}) + \sum_i n_i\mu_i + q(\varepsilon_{VBM} + \Delta V_q + E_F)$$

In the above formula, $E_{tot}$ ($D^q$) represents the total energy in the model having defect D of the charge q, $E_{tot}$ (bulk) represents the total energy in a model without defects, $n_i$ represents the number of atoms i contributing to defects, $\mu_i$ represents the chemical potential of atom i, $\epsilon_{VBM}$ represents the energy of the top of the valence band in the model without defects, $\Delta V_q$ represents the correction term relating to the electrostatic potential, and $E_F$ represents Fermi energy.

Figure 16:
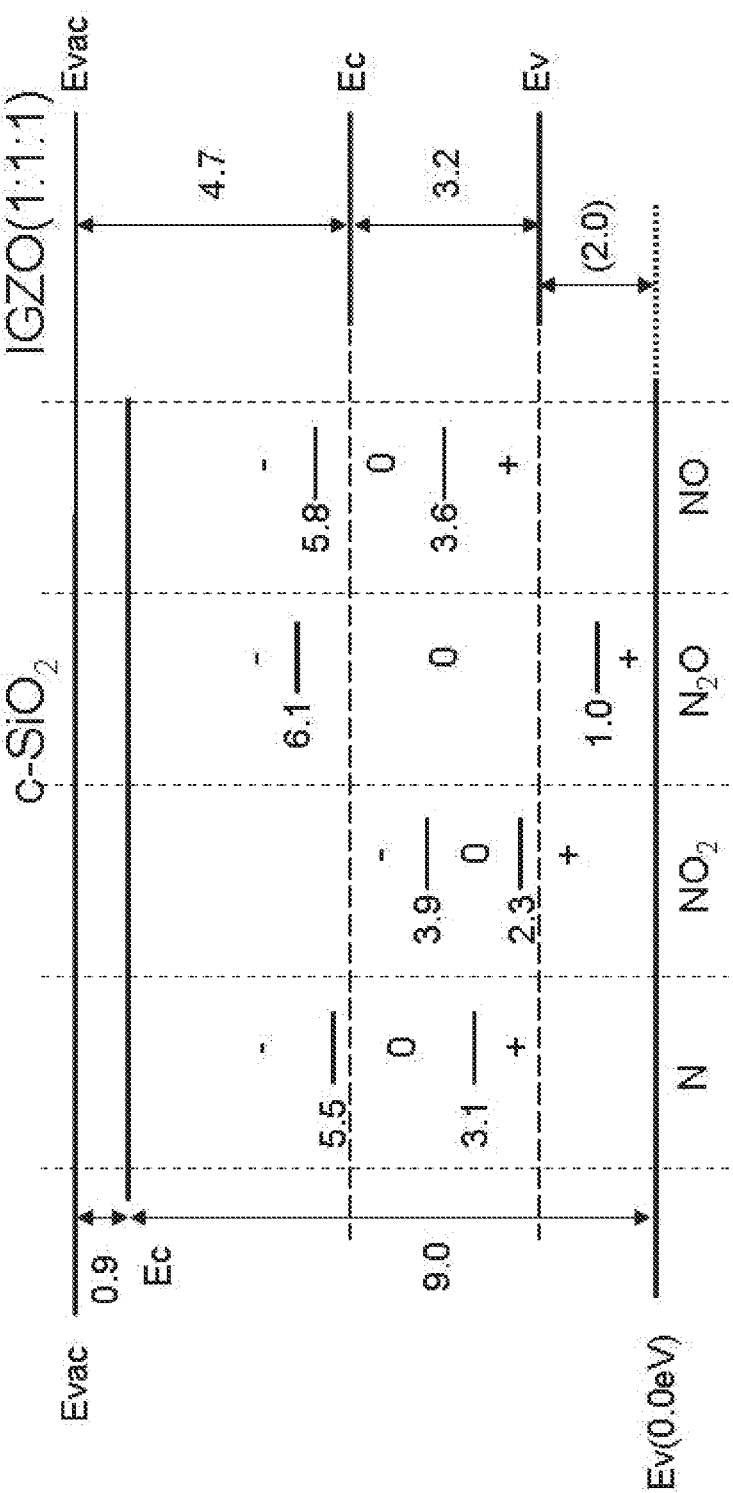
FIG. 16 is band diagrams of one embodiment.

FIG. 16 is band diagrams showing the transition levels obtained from the above formula. In FIG. 16, a band diagram of IGZO (111) is shown in addition to the band diagrams of the above four models.

In FIG. 16, the value of each transition level indicates a value obtained when the top of the valence band of $SiO_2$ is considered as a base (0.0 eV). Although a reference value was used as an electron affinity of $SiO_2$ here, the practical positional relation of the bands in the case where $SiO_2$ is bonded to IGZO (111) is affected by the electron affinity of $SiO_2$ in some cases.

Hereinafter, the transition level for transition between a state where the charge of system is +1 and a state where the charge of system is 0 is referred to as (+/0), and the transition level for transition between a state where the charge of system is 0 and a state where the charge of system is −1 is referred to as (0/−).

According to FIG. 16, in the model in which an $NO_2$ molecule is introduced into $SiO_2$, two transition levels of (+/0) and (0/−) exist at the positions within the band gap of IGZO (111), and there is the possibility that the transition levels relate to trap and detrap of electrons. In both a model in which an NO molecule is introduced into $SiO_2$ and a model in which an N atom is introduced into $SiO_2$, the transition level of (+/0) exits at a position within the band gap of IGZO (111). In contrast, the transition levels of the model in which an $N_2O$ molecule is introduced into $SiO_2$ exist outside of the band gap of IGZO (111), and it is suggested that the $N_2O$ molecule exists stably as a neutral molecule regardless of the position of Fermi level.

The above results strongly suggest that an interstitial molecule containing nitrogen, which relates to trap and detrap of electrons and is a factor causing a shift of the threshold voltage of a transistor in the positive direction, is either $NO_2$ or NO having the transition level at a position within the band gap on a side closer to the conduction band of IGZO (111) or is both of them.

[Examination of ESR Signal]

Following the calculation results of the transition level, ESR signals of $NO_2$ were calculated and examined by comparison with actual measurement. In addition, a model in which an N atom is substituted in a site of an O atom in $SiO_2$ was examined in a manner similar to the above case.

Figure 17:
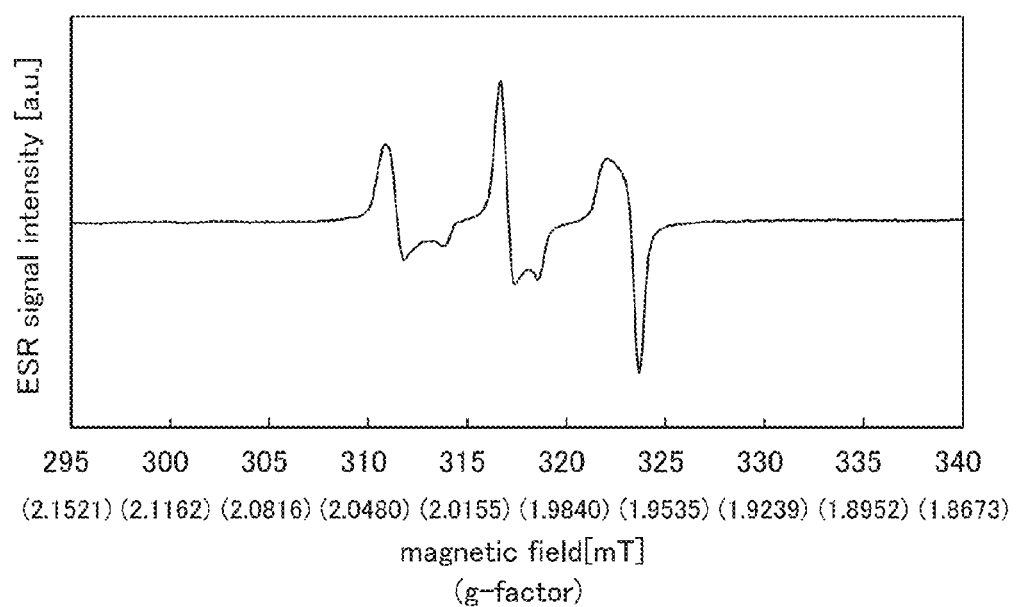
FIG. 17 shows an ESR signal of one embodiment.

First, an ESR signal is described. FIG. 17 shows an enlarged ESR signal in Sample 3 shown in FIG. 10. In FIG. 17, the vertical axis indicates the intensity of ESR signal, and the horizontal axis indicates the magnetic field and g-factor (also referred to as g value). As shown in FIG. 17 a peak of ESR signal is split in three, and each width of the two adjacent peaks is about 5 mT.

In this case, since an N atom has seven electrons, and an O atom has eight electrons, an electron structure of the $NO_2$ molecule has an open shell. Thus, the neutral $NO_2$ has a lone electron, and $NO_2$ can be measured by ESR. In the case where an N atom is substituted in a site of an O atom in $SiO_2$, only two Si atoms exist around an N atom, and one extra electron of the N atom remains. Thus, the case can also be measured by ESR. Furthermore, since $^{14}$N has a nuclear spin of 1, a peak of ESR signal relating to $^{14}$N is split in three. At this time, the split width of ESR signal is a hyperfine coupling constant.

Figure 18A:
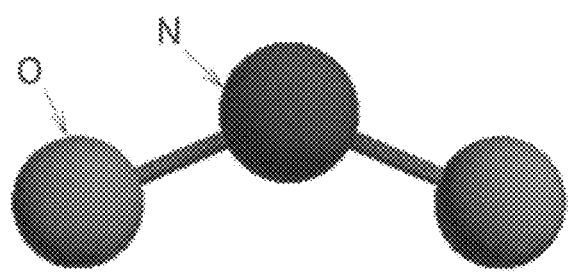
FIGS. 18A and 18B show models of cluster of one embodiment.
Figure 18B:
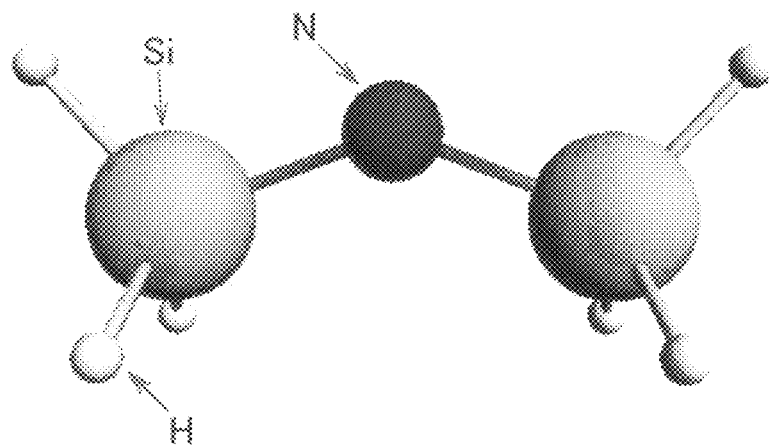

Thus, the derivation of the shape of ESR signal shown in FIG. 17 was examined by calculation to verify whether the shape of ESR signal is derived from an $NO_2$ molecule or whether the shape of ESR signal is derived from an N atom substituted in an O atom site in $SiO_2$. When an $SiO_2$ crystal structure is used as a model, the amount of calculation is enormous. Thus, in this case, two kinds of models of cluster structures as shown in FIGS. 18A and 18B were used, the structure optimization was performed on these models, and then, g-factors and hyperfine coupling constants were calculated. FIG. 18A shows a model of an $NO_2$ molecule in a neutral state, and FIG. 18B shows a cluster model including a Si—N—Si bond. Note that the model shown in FIG. 18B is a cluster model in which a dangling bond of a Si atom is terminated with a H atom.

Amsterdam density functional (ADF) software was used for structure optimization of the models and calculation of the g-factors and hyperfine coupling constants of the models whose structures were optimized. In both of the structure optimization of the models and the calculation of the g-factors and hyperfine coupling constants of the models whose structures were optimized, "GGA:BP" was used as a functional, and "QZ4P" was used as a basic function, and "None" was used as Core Type. In addition, in the calculation of the g-factors and hyperfine coupling constants, "Spin-Orbit" was considered as an effect of theory of relativity, and as a calculation method of ESR/EPR. "g & A-Tensor (full SO)" was employed. The calculation conditions are as follows.

TABLE 2

| Calculation Conditions | |
| --- | --- |
| Software | ADF |
| Basis function | QZ4P |
| Functional | GGA-BP |
| Core Type | None |
| Effect of theory of relativity | Spin-Orbit |
| Calculation method of ESR/EPR | g & A-Tensor (full SO) |

As a result of structure optimization, in the case of the $NO_2$ molecule shown in FIG. 18A, the bonding distance of the N—O bond was 0.1205 nm, and the angle of the O—N—O bond was 134.1°, which are close to experimental values of the $NO_2$ molecule (the bonding distance: 0.1197 nm, and the bonding angle 134.3°). In the case of the Si—N—Si cluster model shown in FIG. 18B, the bonding distance of Si—N was 0.172 nm and the angle of the Si—N—Si bond was 138.3°, which were almost equivalent to the bonding distance of Si—N (0.170 nm) and the angle of the Si—N—Si bond (139.0°) in the structure that had been subjected to structure optimization by first principles calculation in a state where an N atom was substituted in a site of an O atom in the $SiO_2$ crystal.

The calculated g-factors and hyperfine coupling constants are shown below.

As described above, the hyperfine coupling constant A corresponds to the split width of a peak of the ESR signal. According to Table 3, the average value of the hyperfine coupling constant A of $NO_2$ molecule is approximately 5 mT, corresponding to the split width of the peak of the ESR signal in FIG. 17. In the case of the Si—N—Si cluster model, only A_x in the hyperfine coupling constant A is a positive value. The value is about 3 mT that is a smaller value than the split width in FIG. 17.

From this result, it is found that the shape of the ESR signal shown in FIG. 17 is probably derived from the $NO_2$ molecule in the $SiO_2$ crystal rather than from the N atom substituted in the O atom site in $SiO_2$.

[Consideration of Deterioration Mechanism of Transistor]

The mechanism of a phenomenon where the threshold voltage of a transistor to which positive GBT is applied is shifted in the positive direction is considered below, on the basis of the above results.

Figure 19:
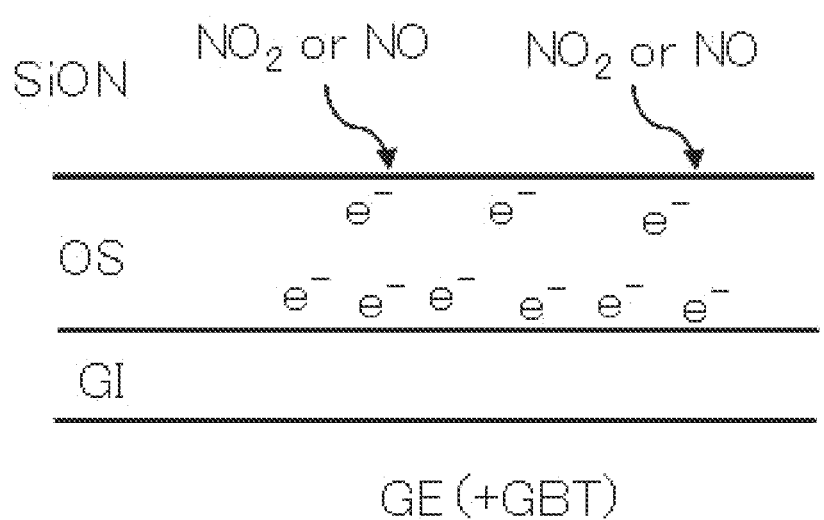
FIG. 19 shows a mechanism of one embodiment.

The mechanism is considered with use of FIG. 19. FIG. 19 shows a structure in which a gate (GE), a gate insulating layer (GI), an oxide semiconductor layer (OS), and a silicon oxide film containing nitrogen (SiON film) are stacked in this order.

When a positive GBT is applied to the transistor, the electron concentration in the semiconductor layer on the back channel side (on the insulating layer side) is increased. Note that the electron concentration on the back channel side is not as high as that in the semiconductor layer on the gate insulating layer side. At that time, $NO_2$ molecules or NO molecules contained in the insulating layer are diffused toward the interface between the semiconductor layer and the insulating layer and trap the electrons on the back channel side, which are induced by the positive GBT. As a result, the trapped electrons remain in the vicinity of the interface between the semiconductor layer and the insulating layer, and thus, the threshold voltage of the transistor is shifted in the positive direction. Such a deterioration model is called an $NO_x$ model.

According to the above, when the concentration of nitrogen contained in an insulating layer in contact with the semiconductor is lower, a shift in the threshold voltage of the transistor can be suppressed. As the insulating layer in contact with the semiconductor layer, an insulating layer in contact with the semiconductor layer on the back channel side, a gate insulating layer, or the like can be given. With the insulating layer having an extremely low nitrogen content, which is provided in contact with the semiconductor layer, a transistor with extremely high reliability can be achieved.

[Effect of Interface Between Semiconductor Layer and Insulating Layer]

A relation between a state of an interface between the semiconductor layer and the insulating layer and a deterioration in characteristics of the transistor are described below.

As described above, impurities or defects in an interface between the semiconductor layer and the insulating layer might serve as carrier traps, which might cause a variation in

TABLE 3

| | g-factor | | | | Hyperfine coupling constant [mT] | | | |
| --- | --- | --- | --- | --- | --- | --- | --- | --- |
| | g_x | g_y | g_z | g (average) | A_x | A_y | A_z | A (average) |
| $NO_2$ | 2.0066 | 1.9884 | 2.0014 | 1.9988 | 4.54 | 4.49 | 6.53 | 5.19 |
| Si—N—Si | 2.0021 | 2.0174 | 2.0056 | 2.0084 | 3.14 | −0.61 | −0.62 | 0.64 | electrical characteristics of the transistor. Thus, when pretreatment for removing impurities or the like on a top surface of the semiconductor layer was performed before an insulating layer that is over and in contact with the semiconductor layer was formed, whether the pretreatment affects the generation of defect states or not was examined.

First, a transistor with a structure shown in FIG. 9 was formed. In formation of the transistor in FIG. 9, after the pair of electrodes 1303 over the semiconductor layer 1302 was processed by etching and before the first insulating layer 1306 was formed, cleaning treatment using phosphoric acid (pretreatment) was performed on the exposed semiconductor layer 1302 to remove a metal element scattered by the etching. Furthermore, with the same formation process, a sample in which a semiconductor layer was not subjected to the pretreatment was formed.

As one method for evaluating defect states in a semiconductor layer, a constant photocurrent method (CPM) is known. CPM measurement is carried out in such a manner that the amount of light with which a surface of a sample is irradiated is adjusted in the state where voltage is applied between a pair of electrodes included in the sample so that a photocurrent value between the pair of electrodes is kept constant, and an absorption coefficient corresponding to a specific wavelength is calculated from the amount of the irradiation light. In the CPM measurement, when the sample has a defect, the absorption coefficient of energy which corresponds to a level at which the defect exists (calculated from a wavelength) is increased. An increase in the absorption coefficient is multiplied by a constant, whereby the defect density (density of state: DOS) of the sample can be obtained.

Figure 20A:
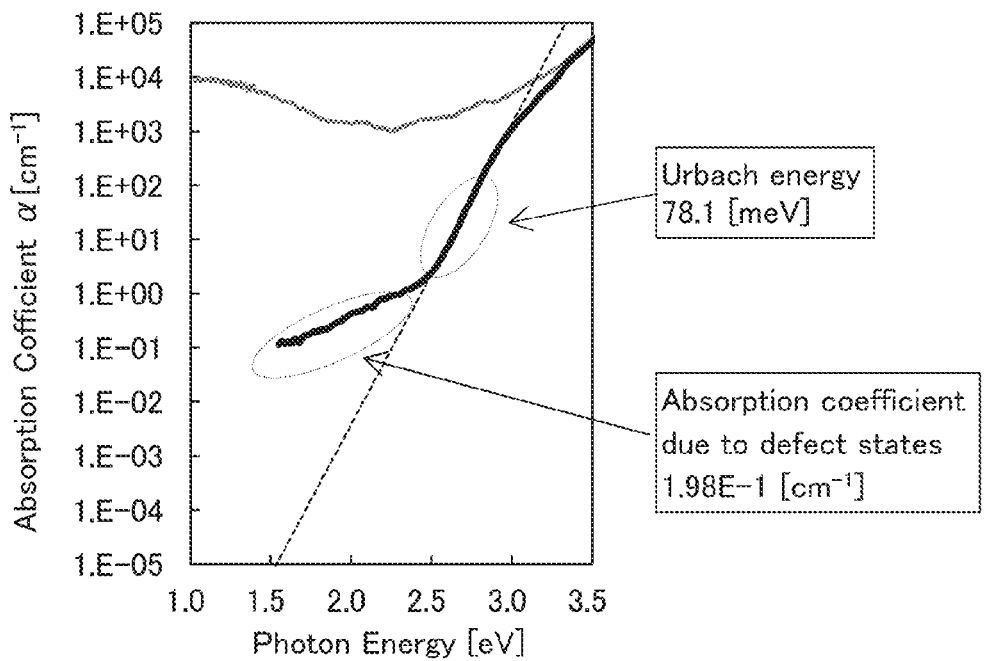
FIGS. 20A and 20B show CPM measurement results of one embodiment.
Figure 20B:
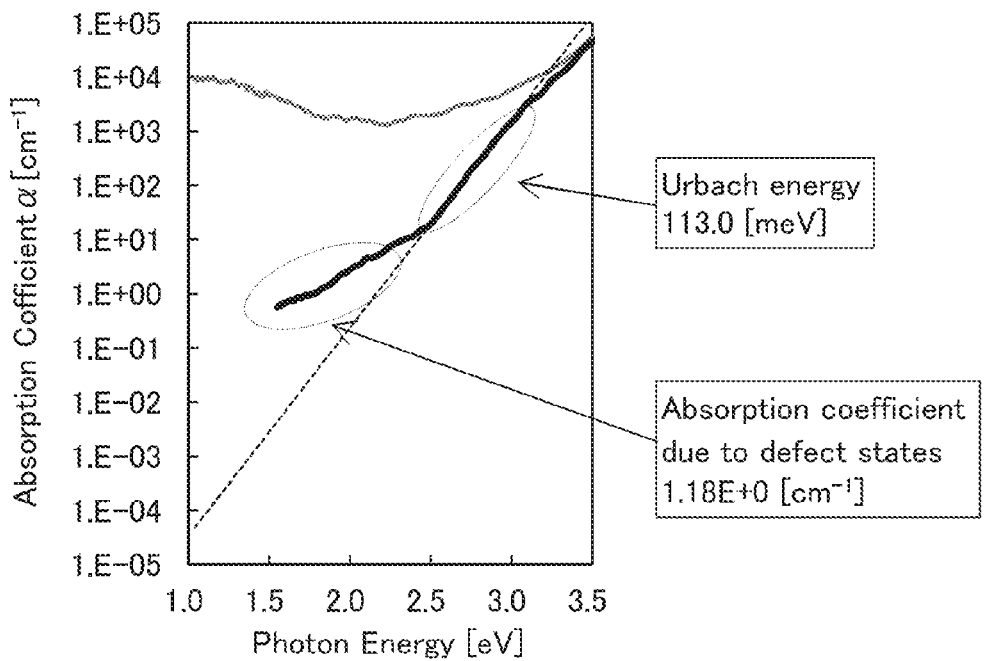

The CPM measurement results performed on two kinds of samples (a sample subjected to pretreatment and a sample not subjected to pretreatment) are shown in FIGS. 20A and 20B. FIG. 20A shows the CPM measurement results of the sample subjected to the pretreatment, and FIG. 20B shows the CPM measurement results of the sample not subjected to the pretreatment.

In each of FIGS. 20A and 20B, the horizontal axis indicates the photon energy, and the vertical axis indicates the absorption coefficient. In addition, a bold curve in each graph indicates the absorption coefficient obtained by CPM measurement performed on each sample, a thin curve indicates the absorption coefficient obtained by optical measurement, and a thin dotted line is an extrapolated straight line corresponding to a straight portion of the absorption coefficient.

The straight portion in the curve indicating the absorption coefficient represents absorption due to urbach tail, and it is known that the slope of the straight portion increases due to disarrangement of atoms or lattice distortion depending on temperature in the case of amorphous silicon or the like, for example. In each graph, a calculated value of urbach energy is shown as an indicator of the slope of the absorption coefficient due to urbach tail. Here, the urbach energy is defined as an energy difference when the absorption coefficient changes by one digit. As the energy of urbach energy increases, the slope of the straight portion of the absorption coefficient is lower.

As for an energy value around the center of the band gap, a portion out of the extrapolated straight line represents absorption due to defect states in the semiconductor. As the density of defect states increases, the difference with the extrapolated straight line increases. Each graph shows a value of absorption coefficient due to defect states (localized level) estimated from a difference between the curve of absorption coefficient and the extrapolated curve.

According to FIGS. 20A and 20B, in the sample subjected to pretreatment before the insulating layer in contact with the semiconductor layer is formed, the absorption coefficient due to defect states is smaller than that in the sample not subjected to pretreatment. In other words, by making the interface between the semiconductor layer and the insulating layer clean, the defect states due to the interface can be reduced.

In addition, in the sample subjected to pretreatment, the urbach energy value is smaller than that in the sample not subjected to pretreatment. In other words, the state of the interface between the semiconductor layer and the insulating layer (e.g., cleanliness) probably effects on the level of tail in the vicinity of the conduction band (the level is also referred to as a tail state).

As described above, when the interface between the semiconductor layer and the insulating layer is cleaner, that is, in the favorable state, generation of interface states serving as carrier traps in the interface can be suppressed. As a result, the electrical characteristics of the transistor are improved, and a variation in electrical characteristics is suppressed; therefore, a transistor with excellent electrical characteristics and high reliability can be achieved.

At least part of this embodiment can be implemented in combination with any of the other embodiments described in this specification as appropriate.

Embodiment 4

In this embodiment, an example of a circuit including the transistor of one embodiment of the present invention is described with reference to drawings.

[Cross-Sectional Structure]

Figure 21A:
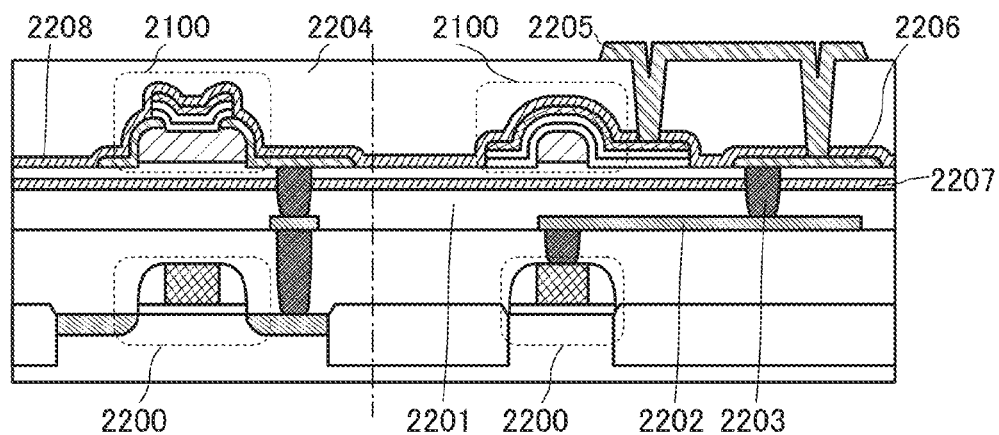
FIGS. 21A to 21C are a cross-sectional view and circuit diagrams of a semiconductor device of one embodiment.

FIG. 21A is a cross-sectional view of a semiconductor device of one embodiment of the present invention. The semiconductor device illustrated in FIG. 21A includes a transistor 2200 containing a first semiconductor material in a lower portion and a transistor 2100 containing a second semiconductor material in an upper portion. In FIG. 21A, an example is described in which the transistor described in Embodiment 2 as an example is used as the transistor 2100 containing the second semiconductor material.

Here, the first semiconductor material and the second semiconductor material are preferably materials having different band gaps. For example, the first semiconductor material can be a semiconductor material (such as silicon, germanium, silicon germanium, silicon carbide, or gallium arsenide) other than an oxide semiconductor, and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 21A illustrates a structure in which the transistor 2100 is provided over the transistor 2200 with an insulating layer 2201 and an insulating layer 2207 provided therebetween. A plurality of wirings 2202 are provided between the transistor 2200 and the transistor 2100. Furthermore, wirings and electrodes provided over and under the insulating layers are electrically connected to each other through a plurality of plugs 2203 embedded in the insulating layers. An insulating layer 2204 covering the transistor 2100, a wiring 2205 over the insulating layer 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating layer provided in the vicinity of the semiconductor layer of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating layer provided in the vicinity of the semiconductor layer of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating layer 2207 having a function of preventing diffusion of hydrogen is provided between the transistors 2100 and 2200. The insulating layer 2207 makes hydrogen remain in the lower portion, thereby improving the reliability of the transistor 2200. In addition, since the insulating layer 2207 suppresses diffusion of hydrogen from the lower portion to the upper portion, the reliability of the transistor 2100 also can be improved.

The insulating layer 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, an insulating layer 2208 having a function of preventing diffusion of hydrogen is preferably formed over the transistor 2100 to cover the transistor 2100 including an oxide semiconductor layer. For the insulating layer 2208, a material that is similar to that of the insulating layer 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating layer 2208 covering the transistor 2100, release of oxygen from the oxide semiconductor layer included in the transistor 2100 can be prevented and entry of water and hydrogen into the oxide semiconductor layer can be prevented.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

Figure 21B:
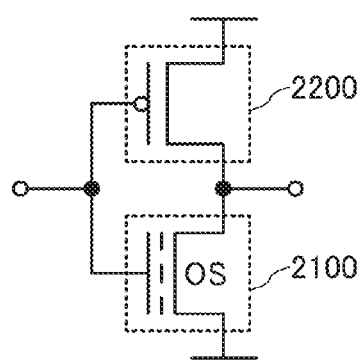

A circuit diagram in FIG. 21B shows a configuration of a so-called CMOS circuit in which the p-channel transistor 2200 and the n-channel transistor 2100 are connected to each other in series and in which gates of them are connected to each other. Note that as illustrated in the drawing, a symbol different from that of a general transistor is written beside a transistor in which negative fixed charges are trapped in charge trap states in a gate insulating layer and thus the threshold voltage is changed.

[Analog Switch]

Figure 21C:
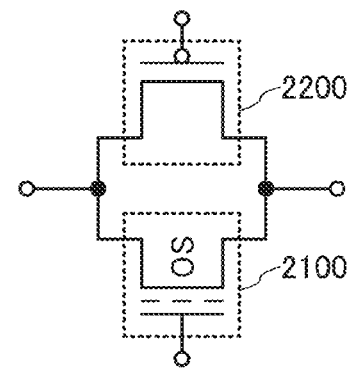

A circuit diagram in FIG. 21C shows a configuration in which sources of the transistors 2100 and 2200 are connected to each other and drains of the transistors 2100 and 2200 are connected to each other. With such a configuration, the transistors can function as a so-called analog switch.

[Memory Device Example]

Figure 22A:
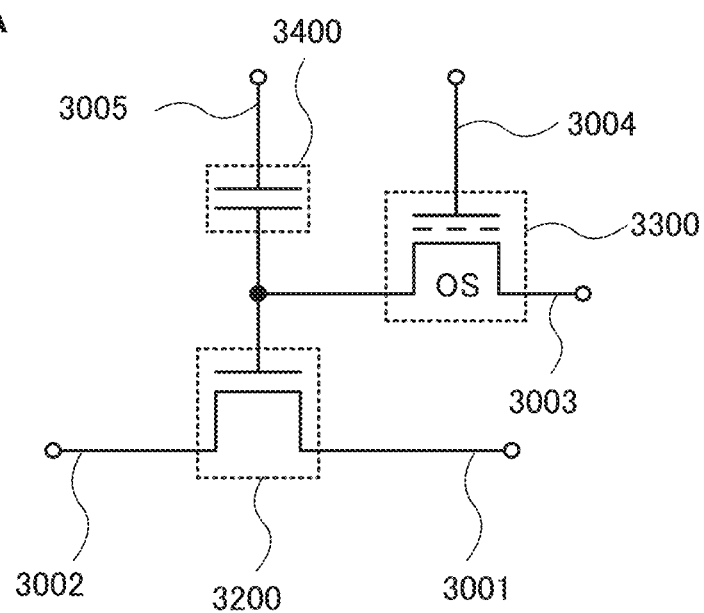
FIGS. 22A and 22B illustrate a structure example of a memory device of one embodiment.
Figure 22B:
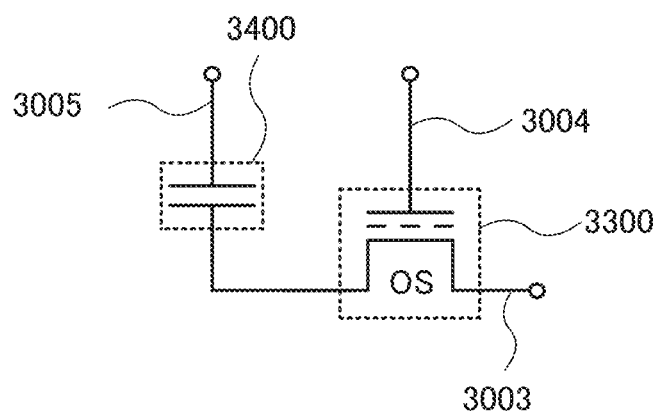

An example of a semiconductor device (memory device) which includes the transistor of one embodiment of the present invention, which can retain stored data even when not powered, and which has an unlimited number of write cycles is shown in FIGS. 22A and 22B.

The semiconductor device illustrated in FIG. 22A includes a transistor 3200 using a first semiconductor material, a transistor 3300 using a second semiconductor material, and a capacitor 3400. Note that any of the above-described transistors can be used as the transistor 3300.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor device in which refresh operation is unnecessary or the frequency of refresh operation is extremely low can be provided.

In FIG. 22A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 22A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device illustrated in FIG. 22B is different mainly from the semiconductor device illustrated in FIG. 22A in that the transistor 3200 is not provided. Also in this case, writing and retaining operation of data can be performed in a manner similar to the semiconductor device illustrated in FIG. 22A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

At least part of this embodiment can be implemented in combination with any of the other embodiments described in this specification as appropriate.

Embodiment 5

In this embodiment, an RFID tag that includes the transistor described in the above embodiments or the memory device described in the above embodiment is described with reference to FIG. 23.

The RFID tag of this embodiment includes a memory circuit, stores necessary data in the memory circuit, and transmits and receives data to/from the outside by using contactless means, for example, wireless communication. With these features, the RFID tag can be used for an individual authentication system in which an object or the like is recognized by reading the individual information, for example. Note that the RFID tag is required to have extremely high reliability in order to be used for this purpose.

A configuration of the RFID tag will be described with reference to FIG. 23. FIG. 23 is a block diagram illustrating a configuration example of an RFID tag.

Figure 23:
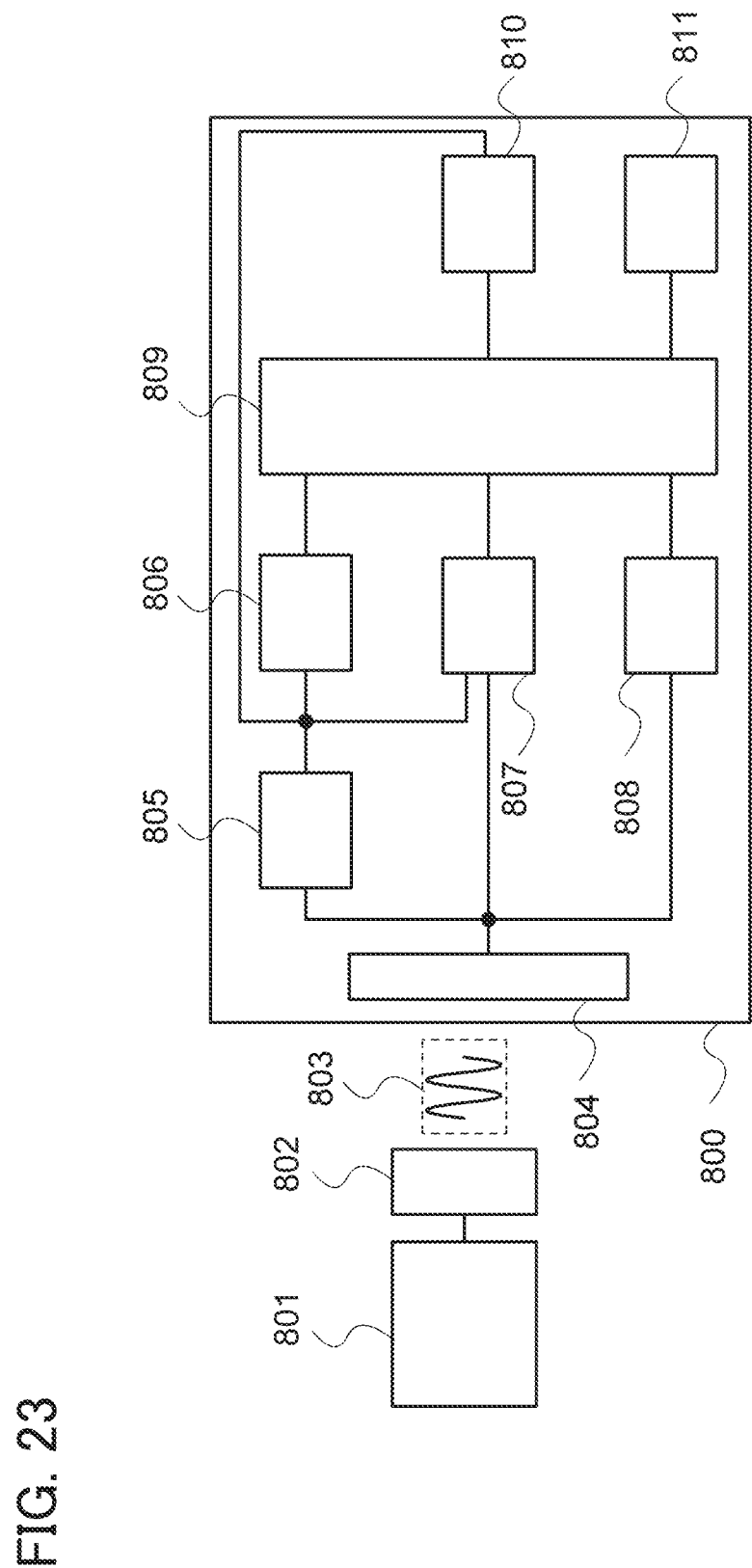
FIG. 23 illustrates a structure example of an RFID tag of one embodiment.

As shown in FIG. 23, an RFID tag 800 includes an antenna 804 which receives a radio signal 803 that is transmitted from an antenna 802 connected to a communication device 801 (also referred to as an interrogator, a reader/writer, or the like). The REID tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RFID tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers to only good products to be shipped. Thus, the identification numbers of the shipped products are in series and customer management corresponding to the shipped products is easily performed.

At least part of this embodiment can be implemented in combination with any of the other embodiments described in this specification as appropriate.

Embodiment 6

In this embodiment, a CPU in which at least the transistor described in any of the above embodiments can be used and the memory device described in the above embodiment is included is described.

Figure 24:
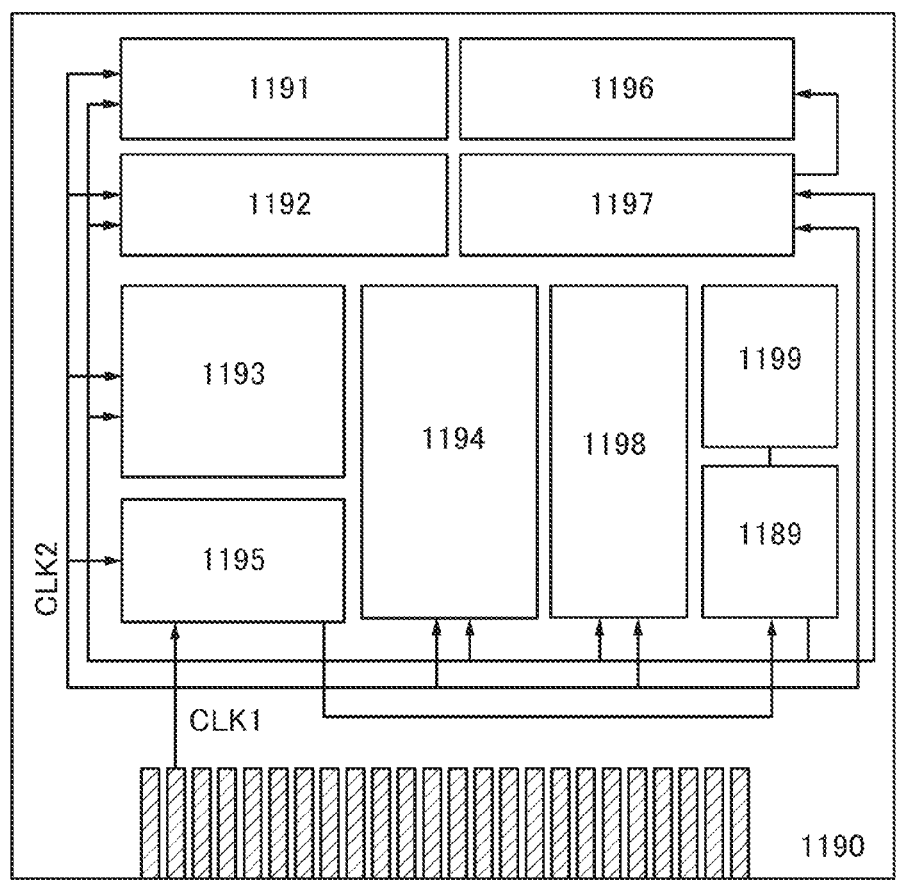
FIG. 24 illustrates a structure example of a CPU of one embodiment.

FIG. 24 is a block diagram illustrating a configuration example of a CPU at least partly including any of the transistors described in the above embodiments as a component.

The CPU illustrated in FIG. 24 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 24 is just an example in which the configuration has been simplified, and an actual CPU may have a variety of configurations depending on the application. For example, the CPU may have the following configuration: a structure including the CPU illustrated in FIG. 24 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 24, a memory cell is provided in the register 1196. For the memory cell of the register 1196, any of the transistors described in the above embodiments can be used.

In the CPU illustrated in FIG. 24, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 25:
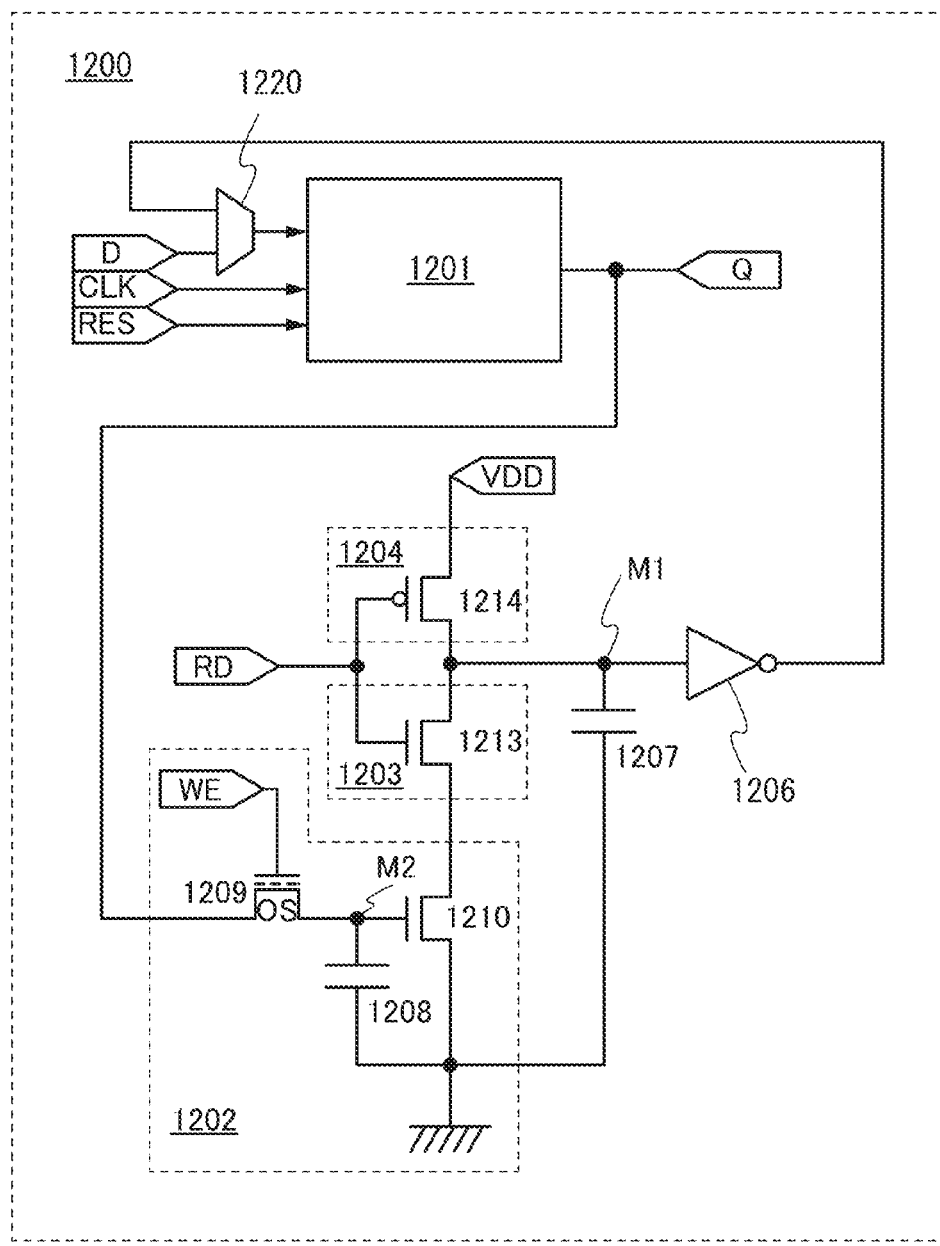
FIG. 25 is a circuit diagram of a memory element of one embodiment.

FIG. 25 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 25 illustrates an example in which a signal output from the circuit 1201 is input, to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 25, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 25, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 25, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs precharge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

Embodiment 7

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 26A to 26F illustrate specific examples of these electronic devices.

Figure 26A:
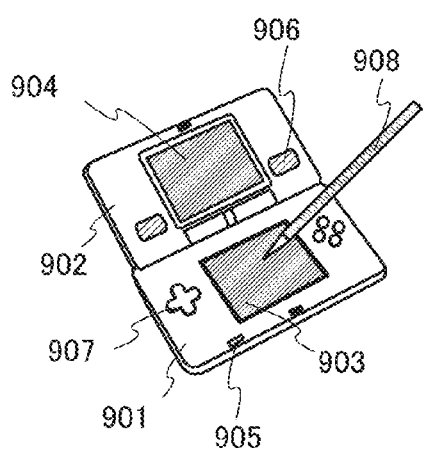
FIGS. 26A to 26F each illustrate an electronic device of one embodiment.

FIG. 26A illustrates a portable game console including a housing 901, a housing 902, a display portion 903, a display portion 904, a microphone 905, a speaker 906, an operation key 907, a stylus 908, and the like. Although the portable game machine in FIG. 26A has the two display portions 903 and 904, the number of display portions included in a portable game machine is not limited to this.

Figure 26B:
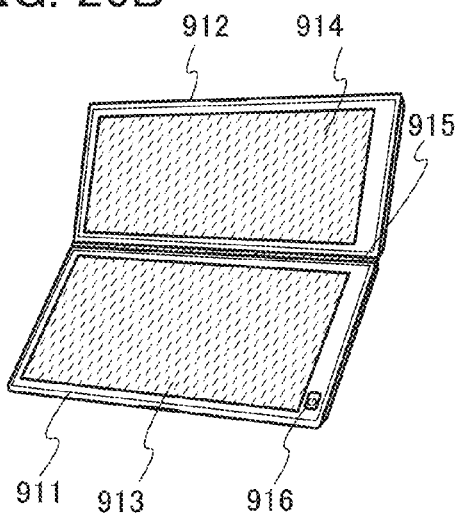

FIG. 26B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 26C:
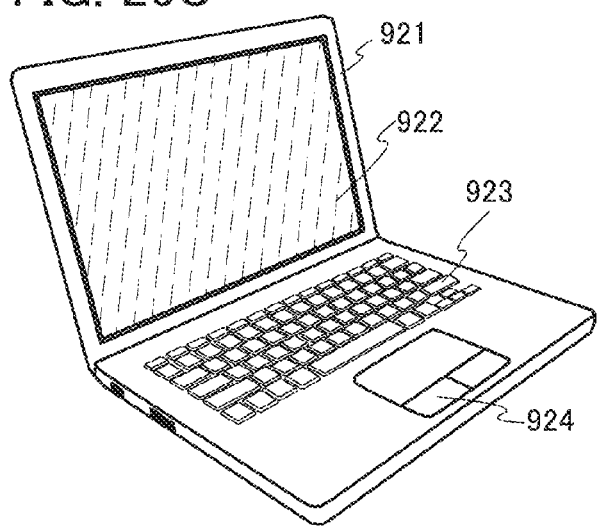

FIG. 26C illustrates a laptop personal computer, which includes a housing 921, a display portion 922, a keyboard 923, a pointing device 924, and the like.

Figure 26D:
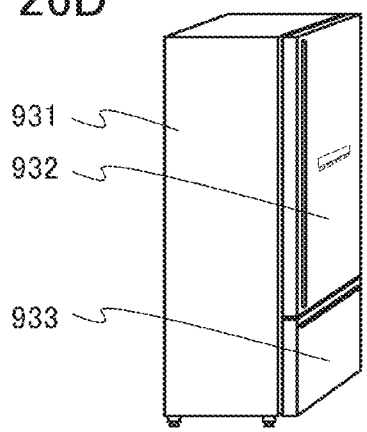

FIG. 26D illustrates an electric refrigerator-freezer including a housing 931, a door for a refrigerator 932, a door for a freezer 933, and the like.

Figure 26E:
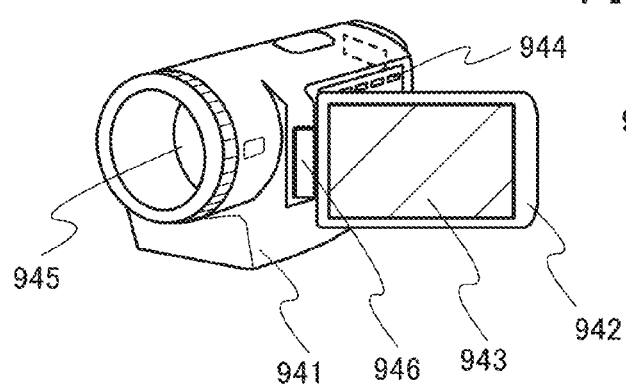

FIG. 26E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 26F:
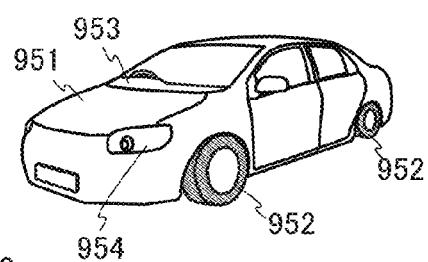
Figure 27A:
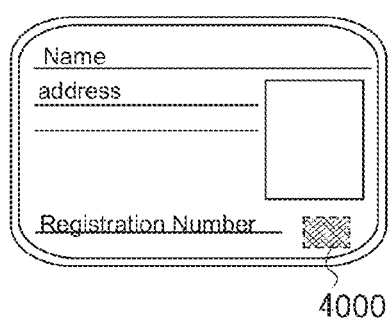
FIGS. 27A to 27F each illustrate an application example of an RFID of one embodiment.
Figure 27B:
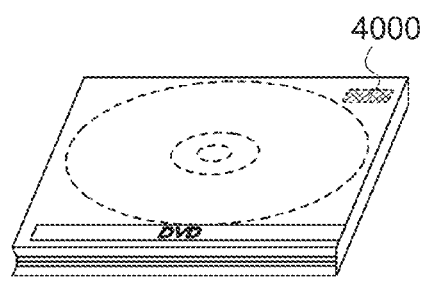
Figure 27C:
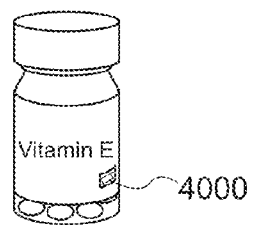
Figure 27D:
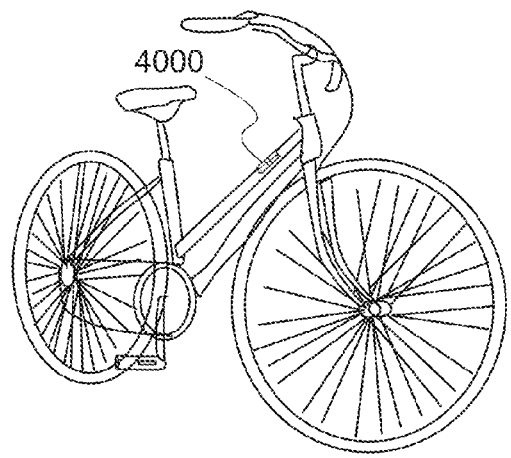
Figure 27E:
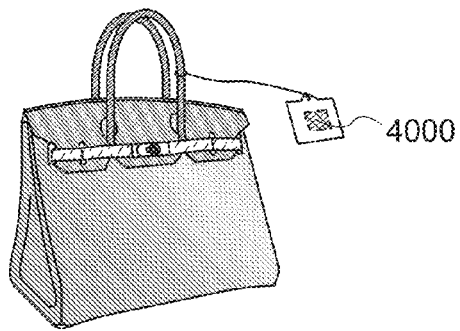
Figure 27F:
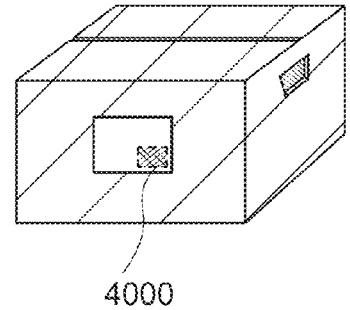

FIG. 26F illustrates an ordinary vehicle including a car body 951, wheels 952, a dashboard 953, lights 954, and the like.

At least part of this embodiment can be implemented in combination with any of the other embodiments described in this specification as appropriate.

Embodiment 8

In this embodiment, application examples of an RFID of one embodiment of the present invention will be described with reference to FIGS. 27A to 27F. The RFID is widely used and can be provided for, for example, products such as bills, coins, securities, bearer bonds, documents (e.g., driver's licenses or resident's cards, see FIG. 27A), packaging containers (e.g., wrapping paper or bottles, see FIG. 27C), recording media (e.g., DVD software or video tapes, see FIG. 27B), vehicles (e.g., bicycles, see FIG. 27D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 27E and 27E).

An RFID 4000 of one embodiment of the present invention is fixed to a product by being attached to a surface thereof or embedded therein. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic devices, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

At least part of this embodiment can be implemented in combination with any of the other embodiments described in this specification as appropriate.

This application is based on Japanese Patent Application serial no. 2013-165829 filed with Japan Patent Office on Aug. 9, 2013, the entire contents of which are hereby incorporated by reference.

What is claimed is:

1. A semiconductor device comprising:
a semiconductor layer;
a gate electrode overlapping with the semiconductor layer;
a first gate insulating layer between the semiconductor layer and the gate electrode; and
a second gate insulating layer between the first gate insulating layer and the gate electrode,
wherein the semiconductor layer includes an oxide semiconductor,
wherein the first gate insulating layer includes an oxide whose nitrogen content is lower than or equal to 5 at. %, and
wherein the second gate insulating layer includes a charge trap state.

2. The semiconductor device according to claim 1,
wherein an electron is trapped in the charge trap state, and
wherein the second gate insulating layer is negatively charged.

3. The semiconductor device according to claim 1, wherein the second gate insulating layer includes hafnium oxide.

4. The semiconductor device according to claim 1, wherein the first gate insulating layer includes silicon oxide.

5. The semiconductor device according to claim 1, wherein the oxide semiconductor is an In—Ga—Zn-based oxide.

6. The semiconductor device according to claim 1,
wherein the semiconductor layer includes crystals of the oxide semiconductor,
wherein each c-axis of the crystals is aligned in a direction perpendicular to a surface of the semiconductor layer, and
wherein each of the crystals is a non-single-crystal.

7. The semiconductor device according to claim 1, wherein the gate electrode faces a side surface of the semiconductor layer.

8. The semiconductor device according to claim 1, further comprising:
a source electrode in contact with a side surface of the semiconductor layer; and
a drain electrode in contact with a side surface of the semiconductor layer,
wherein the gate electrode faces a side surface of the semiconductor layer.

9. The semiconductor device according to claim 1, wherein the gate electrode is located over the semiconductor layer.

10. The semiconductor device according to claim 1, wherein the nitrogen content is lower than or equal to 0.1 at. %.

11. A semiconductor device comprising:
a semiconductor layer;
a gate electrode overlapping with the semiconductor layer;
a first gate insulating layer between the semiconductor layer and the gate electrode; and
a second gate insulating layer between the first gate insulating layer and the gate electrode,
wherein the semiconductor layer includes an oxide semiconductor,
wherein the first gate insulating layer includes silicon oxide whose nitrogen content is lower than or equal to 5 at. %, and
wherein the second gate insulating layer includes hafnium oxide and is negatively charged.

12. The semiconductor device according to claim 11, wherein the oxide semiconductor is an In—Ga—Zn-based oxide.

13. The semiconductor device according to claim 11,
wherein the semiconductor layer includes crystals of the oxide semiconductor,
wherein each c-axis of the crystals is aligned in a direction perpendicular to a surface of the semiconductor layer, and
wherein each of the crystals is a non-single-crystal.

14. The semiconductor device according to claim 11, wherein the gate electrode faces a side surface of the semiconductor layer.

15. The semiconductor device according to claim 11, further comprising:
a source electrode in contact with a side surface of the semiconductor layer; and
a drain electrode in contact with a side surface of the semiconductor layer,
wherein the gate electrode faces a side surface of the semiconductor layer.

16. The semiconductor device according to claim 11, wherein the gate electrode is located over the semiconductor layer.

17. The semiconductor device according to claim 11, wherein the nitrogen content is lower than or equal to 0.1 at. %.

18. A semiconductor device comprising:
a transistor comprising:
a semiconductor layer;
a gate electrode overlapping with the semiconductor layer;
a first gate insulating layer between the semiconductor layer and the gate electrode; and
a second gate insulating layer between the first gate insulating layer and the gate electrode,
wherein the semiconductor layer includes an oxide semiconductor,
wherein the first gate insulating layer includes silicon oxide whose nitrogen content is lower than or equal to 5 at. %,
wherein the second gate insulating layer includes hafnium oxide, and wherein a threshold voltage of the transistor is higher than or equal to 0 V.

19. The semiconductor device according to claim 18, wherein the oxide semiconductor is an In—Ga—Zn-based oxide.

20. The semiconductor device according to claim 18,
wherein the semiconductor layer includes crystals of the oxide semiconductor,
wherein each c-axis of the crystals is aligned in a direction perpendicular to a surface of the semiconductor layer, and
wherein each of the crystals is a non-single-crystal.

21. The semiconductor device according to claim 18, wherein the gate electrode faces a side surface of the semiconductor layer.

22. The semiconductor device according to claim 18, further comprising:
a source electrode in contact with a side surface of the semiconductor layer; and
a drain electrode in contact with a side surface of the semiconductor layer,
wherein the gate electrode faces a side surface of the semiconductor layer.

23. The semiconductor device according to claim 18,
wherein the semiconductor layer is sandwiched between a first oxide layer and a second oxide layer between the semiconductor layer and the first gate insulating layer, and
wherein the first oxide layer and the second oxide layer each include one or more metal elements included in the semiconductor layer.

24. The semiconductor device according to claim 18, wherein the gate electrode is located over the semiconductor layer.

25. The semiconductor device according to claim 18, wherein the nitrogen content is lower than or equal to 0.1 at. %.

26. A semiconductor device comprising:
a semiconductor layer;
a gate electrode overlapping with the semiconductor layer; and
a first insulating layer in contact with the semiconductor layer,
wherein the semiconductor layer includes an oxide semiconductor,
wherein the first insulating layer includes an oxide, and
wherein a spin density of the first insulating layer is at most $1.5 \times 10^{19}$ spins/cm$^3$, the spin density is a spin density of a signal observed by electron spin resonance measurement, wherein a g value of the signal is 2.001 and a hyperfine coupling constant of the signal is approximately 5 mT.

27. The semiconductor device according to claim 26, wherein the oxide semiconductor is an In—Ga—Zn-based oxide.

28. The semiconductor device according to claim 26,
wherein the semiconductor layer includes crystals of the oxide semiconductor,
wherein each c-axis of the crystals is aligned in a direction perpendicular to a surface of the semiconductor layer, and
wherein each of the crystals is a non-single-crystal.

29. The semiconductor device according to claim 26,
wherein the gate electrode is located under the semiconductor layer, and
wherein the first insulating layer is located between the gate electrode and the semiconductor layer.

30. The semiconductor device according to claim 26, wherein the spin density of the first insulating layer is at most $1.1 \times 10^{18}$ spins/cm$^3$.

31. A semiconductor device comprising:
a semiconductor layer;
a gate electrode overlapping with the semiconductor layer; and
a first insulating layer in contact with the semiconductor layer,
wherein the semiconductor layer includes an oxide semiconductor,
wherein the first insulating layer includes an oxide, and
wherein a spin density of the first insulating layer is at most $1.5 \times 10^{19}$ spins/cm$^3$, the spin density being derived from NO$_2$.

32. The semiconductor device according to claim 31, wherein the oxide semiconductor is an In—Ga—Zn-based oxide.

33. The semiconductor device according to claim 31,
wherein the semiconductor layer includes crystals of the oxide semiconductor,
wherein each c-axis of the crystals is aligned in a direction perpendicular to a surface of the semiconductor layer, and
wherein each of the crystals is a non-single-crystal.

34. The semiconductor device according to claim 31,
wherein the gate electrode is located under the semiconductor layer, and
wherein the first insulating layer is located between the gate electrode and the semiconductor layer.

35. The semiconductor device according to claim 31, wherein the spin density of the first insulating layer is at most $1.1 \times 10^{18}$ spins/cm$^3$.

* * * * *